(12) United States Patent
Paton Alvarez et al.

(10) Patent No.: US 9,577,663 B1
(45) Date of Patent: Feb. 21, 2017

(54) BANDWIDTH EXTENSION OF OVERSAMPLED ANALOG-TO-DIGITAL CONVERTERS BY MEANS OF GAIN BOOSTING

(71) Applicant: Infineon Technologies Austria AG, Villach (AT)

(72) Inventors: Susana Paton Alvarez, Madrid (ES); Laura Conesa-Peraleja Ruano, Pozuelo de Alarcon (ES); Dietmar Straeussnigg, Villach (AT); Andreas Wiesbauer, Poertschach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/873,939

(22) Filed: Oct. 2, 2015

(51) Int. Cl.
  *H03M 3/00* (2006.01)
  *H03M 1/00* (2006.01)
  *H03M 1/12* (2006.01)

(52) U.S. Cl.
  CPC ............ *H03M 3/464* (2013.01); *H03M 3/424* (2013.01); *H03M 1/00* (2013.01); *H03M 1/12* (2013.01); *H03M 3/30* (2013.01)

(58) Field of Classification Search
  CPC ............ H03M 3/30; H03M 1/12; H03M 1/00
  USPC ................................ 341/143, 155, 156, 120
  See application file for complete search history.

(56) References Cited

U.S. PATENT DOCUMENTS

| | | |
|---|---|---|
| 2014/0177874 A1 | 6/2014 | Bogason et al. |
| 2014/0368368 A1* | 12/2014 | Koli ............ H03M 3/462 341/143 |

OTHER PUBLICATIONS

Yip, Marcus. "A Resolution-Reconfigurable 5-to-10b 0.4-to-1V Power Scalable SAR ADC." ISSCC 2011/Session 10/Nyquist-Rate Converters/10.6. 2011 IEEE International Solid-State Circuits Conference. pp. 190-191.
Putter, B. "A 5th-order CT/DT Multi-Mode Delta Sigma Modulator." ISSCC 2007/Session 13/Delta Sigma ADCs and Converter Techniques/13.4. 2007 IEEE International Solid-State Circuits Conference. pp. 244-245.
Dezzani, Alessandro et al. "A 1.2-V Dual-Mode WCDMA/GPRS Sigma Delta Modulator." ISSCC 2003/Session 3/Oversampled A/D Converters/Paper 3.3. 2003 IEEE International Solid-State Circuits Conference. 3 pages.
van Veldhoven, Robert. "A Tri-Mode Continuous-Time Sigma Delta Modulator with Switched-Capacitor Feedback DAC for GSM-EDGE/CDMA2000/UMTS Receiver." ISSCC 2003/Session 3/Oversampled A/D Converters/Paper 3.4. 10 pages.

(Continued)

*Primary Examiner* — Joseph Lauture
(74) *Attorney, Agent, or Firm* — Eschweiler & Potashnik, LLC

(57) ABSTRACT

A digitized system operates to receive one or more analog signals from a sensor or other component and convert the analog signals to one or more digital signals. An analog-to-digital converter comprises a loop filter, a quantizer and one or more feedback digital-to-analog converters. A gain component provides coefficients along different points of a signal processing path to extend a bandwidth of the analog-to-digital converter. The gain component can modify a signal transfer function of the analog-to-digital converter while preserving a noise transfer function in order to process a signal in a higher frequency band in an extended mode of operation than other signals being processed in a normal operating mode.

22 Claims, 18 Drawing Sheets

(56) References Cited

OTHER PUBLICATIONS

Zorn, Christoph et al. "STF Optimization of 1-Bit CT Sigma Delta Modulators Based on Scaled Loop Filter Coefficients." 2011 20th European Conference on Circuit Theory and Design (ECCTD). pp. 266-269.
De Maeyer, J. et al. "Controlled behaviour of STF in CT Sigma Delta modulators." Electronic Letters Aug. 4, 2005, vol. 41, No. 16. 2 pages.
Electronics Letters Jun. 7, 2001, vol. 37, No. 12. pp. 737-738.

\* cited by examiner

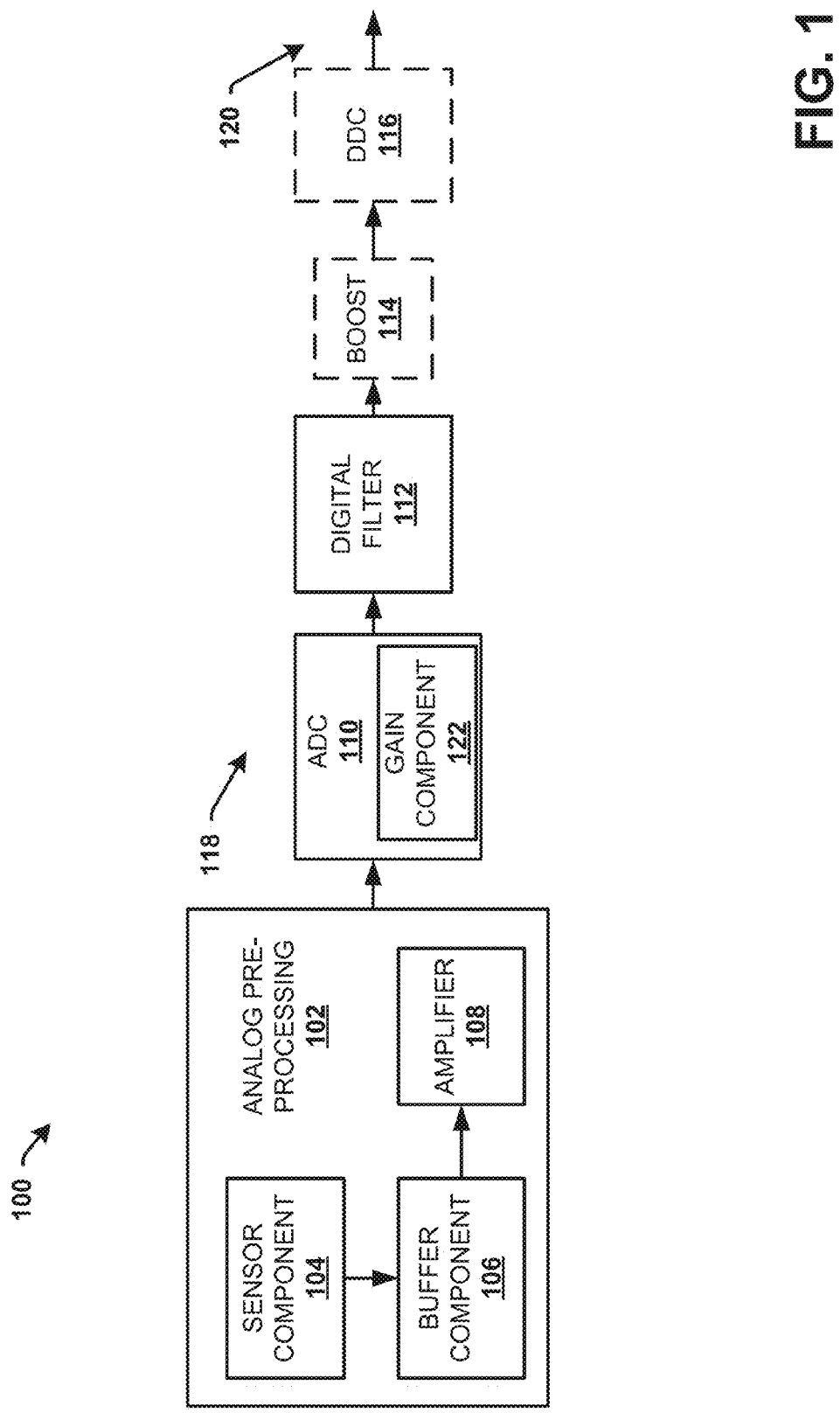

BANDWIDTH EXTENSION OF OVERSAMPLED ANALOG-TO-DIGITAL CONVERTERS BY MEANS OF GAIN BOOSTING

FIELD

The present disclosure relates to analog-to-digital converters and more specifically, to extending the bandwidth of analog-to-digital converters by means of gain boosting.

BACKGROUND

Engineering of microphone systems strives to accommodate large dynamic frequency ranges with a low consumption of power. Microelectromechanical system (MEMS) microphones comprise systems integrated on a chip (e.g., a microphone chip or a silicon microphone), in which a pressure sensitive diaphragm is etched into silicon or another substrate for sensing acoustic signals. The MEMS microphone can have an integrated preamplifier on the chip or other integrated components such as an analog-to-digital converter (ADC) circuit, which enables the chip to operate as a digital microphone capable of being readily integrated with various modern digital products. There continues to be a need for such audio systems or other digitizing systems with integrated components to process data more efficiently and with greater variability in operation.

BRIEF DESCRIPTION OF THE DRAWINGS

FIG. 1 is a block diagram illustrating a digitizing system in accordance with various aspects.

DETAILED DESCRIPTION

Figure 2A:
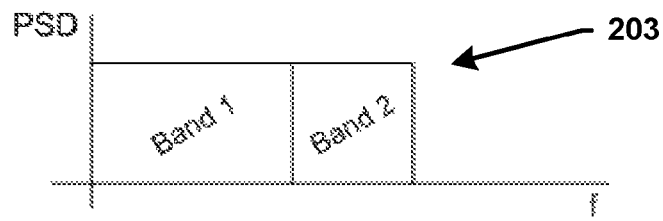
FIGS. 2a-2e illustrate graphs of two non-overlapping signal bands being processed concurrently or simultaneously in accordance with various aspects.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a circuit, a processor, a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Overview

In consideration of the above described deficiencies of digital systems (e.g., audio systems) for functioning components with large dynamic ranges and low power, an analog-to-digital (ADC) converter such as a multi-mode analog (e.g., a delta-sigma converter (DSC)) is proposed that increases a gain of the signal transfer function while keeping the noise transfer function unaffected. For example, a digital system such as an audio sensor system or the other digitizing system is described, which can be configured to operate with an ADC (e.g., a delta-sigma ADC or the like) that is configured to boost or increase the signal bandwidth to process different frequency operating bands for various applications. A frequency band can be referred to as an operating band, a signal band, or other similar terminology that refers to a particular type of band (e.g., CDMA, GSM, LTE, LTE-A, E-UTRA, or the like) that have different data streams simultaneously or concurrently in different frequency ranges, such as with a carrier aggregation (CA) or other simultaneous communication scheme for achieving higher data rates in either uplink or downlink modes of operation along different frequency ranges.

The ADC, for example, can operate within a microphone system or in other digital systems or devices utilizing audio sensors, such as a MEMS sensor, other type sensors, or without sensors in a digital signal processing pathway. In one example, a digital device (e.g., an acoustic sensing device such as a microphone or other digital device) can comprise an ADC. The ADC can be a delta-sigma converter that receives electrical signals (e.g., analog signals) being generated. Based on audio signals causing changes in a membrane, for example, a sensor or other component can generate analog signals as the electrical signals being received at the delta-sigma converter. A gain component, as part of, or external to the delta-sigma converter can modify a signal transfer function (STF) to generate an extension of a bandwidth for processing one of the electrical signals in a different frequency band than a frequency band of another electrical signal. The gain component can comprise feedforward paths including coefficient components that provide different coefficients to a signal processing path of the delta-sigma converter. These coefficients can be activated respectively and alter the STF by generating a signal gain to enable processing in a higher band, such as an ultrasonic frequency band or other band. The delta-sigma converter can operate in different modes (an extension mode or normal processing mode) to process different frequency bands concurrently, simultaneously or at different times for various applications. The modification of STF can boost or amplify the signal gain outside of a bandwidth of the ADC or DSC, providing a targeted bandwidth extension for signal processing, while maintaining, preserving or otherwise unaffecting a noise transfer function (NTF) at the same time. Additional aspects and details of the disclosure are further described below with reference to figures.

Illustrated Embodiments

FIG. 1 illustrates an example of a digital system 100 (e.g., a microphone system, a sensor system or other digitizing system) that operates to facilitate a communication of a datum and a supply signal to provide a dynamic range of acoustic or audio processing in accord with various aspects. The system 100 can comprise, for example, one or more audio components of an audio device, which can include a recording device (e.g., a microphone, a digital recorder, or the like), a computer system having a processor and memory, a mobile device, or other device that is configured to operate sound recording, sound processing or communications within frequency ranges. The system 100 can also comprise modulator processing components for processing signals (e.g., acoustic or audio signals, or other sensed signals with different property data) as well as additional components.

The system 100, for example, can comprise an analog pre-processing component 102 that comprises, for example, a sensor component 104 or other signal generation component, a buffer component 106, and an amplifier 108. Although sensors or sensor components are discussed herein any signal generating device or signal receiving component can be utilized in addition to or alternative to a sensor. The sensor component 104 of this example can comprise an acoustic sensor or a MEMS component, for example, that operates to generate an analog signal according to a change in a membrane or a diaphragm that results in a differential (e.g., voltage or signal differential) being generated from audio signals acting upon the diaphragm. The sensor 104 can operate to provide electrical signals to an application specific integrated circuit (ASIC) or further processing components, including an ADC 110, a digital filter 112, a frequency boosting component 114 or a sigma-delta digital-to-digital converter 116.

The buffer 106 can interface the sensor component 104 to subsequent components of the analog device 100 while maintaining a high SNR and low signal loss. The amplifier 108 amplifies the signals to acceptable levels in the analog pre-processing and provides the pre-processing output signals to the ADC 110.

The ADC 110 can be configured to implement an nth order (e.g., second, third or other order) noise shaping resulting in a quantization noise increase, while modifying the STF and preserving or unaffecting any further NTF changes as a result. As used herein, "order" refers to how steep the cutoff is in a frequency response. In order to obtain sufficiently acceptable audio performance with the third order noise shaping, for example, the ADC 110 can be coupled to a multi-bit quantizer with quantization codes in a range of values.

The system 100 can be integrated in a single package, on a printed circuit board, an application specific integrated circuit (ASIC), or have separate components that are external, internal or a combination thereof to a circuit board. The ADC 110 can include one or more different other components coupled thereto for further signal processing of a digital output signal along a signal processing path or data path 118. For example, the data path component 118 can comprise a high-impedance biasing network and the buffer component 106, amplifier or attenuator for buffering the MEMS signal or other sensor signal to a data or signal processing path 118.

The data path 118 can include the digital filter 112 to attenuate high frequency components. For example, the digital filter 112 can be a low pass filter, or other type of filter (e.g., high pass, band pass, another low pass filter, or a combination of filters thereof). The equalizer or boost component 114 and the sigma-delta DDC 116 can be a part of or connected to the data path 118 for signal processing within the audio system or not based on the particular application. The boost component 114 can provide an ultrasonic amplifying operation for signals along any point of the data path 118, and the gain component 122 can operate by affecting one frequency band or signal while not affecting another frequency band or signal when processing multiple different frequency bands concurrently or simultaneously. Thus, the performance of the system 100 can be preserved via the gain component 122, while operating as a digital equalizer via the boost component 114. The system 100 can then enable amplifying one frequency band (or frequency range of operation), such as a digitized ultrasonic band, while keeping the other bands being processed unaffected. This is advantageous, for example, when the DDC 116 is connected to the data path 118 in order to eliminate added noise from the DDC 116 itself. In this case where the DDC noise can be dominant, the signal can be boosted over DDC noise. The main drawback of this solution with just a boost 114 and DDC 116 and not a gain component 122 in the path 118 is that it can be useful if the system has another source of noise that is dominant, as the noise injected at the DDC. However, if such DDC 116 does not exist or is not connected in the data path 118 for further processing, the noise can also boosted and the effect of the equalizer is not as visible. Moreover, the signal cannot be amplified indefinitely, because the DDC can be severely overloaded.

The Sigma-Delta DDC 116 can perform, for example, an nth order (e.g., a second, third, fourth order or other nth order) noise shaping in order to deliver a PDM bit stream or other data stream that has the properties expected by the external chipsets and codecs. The Sigma-Delta DDC 116 can create a 1-bit, 64 fs (or other rate) signal as an output, for example.

In one embodiment, the ADC 110 is configured to connect with or include the gain component 122. The gain component 122 can receive input signals that the ADC 110 also receives from the analog pre-processing component 102, and further facilitates the ADC 110 in generating digital output signals based on the inputs signals by increasing a bandwidth for at least one frequency band of the signals being processed in different bands. For example, the gain component 122 can modify a signal transfer function of the ADC 110 to generate an extension of a bandwidth for processing one of the input signals in an extension mode, which could be operating in a frequency band at an ultrasonic frequency or other higher frequency than other signals being processed concurrently or simultaneously in a normal mode with a lower operating frequency band.

Referring to FIGS. 2a-2e, illustrated are example graphs 200 of two adjacent and non-overlapping signal frequency bands that could be processed along a signal processing path of the ADC 110. The horizontal axis represents frequency (f) and the vertical axis represents power spectral density (PSD) or power as contributed by the signal being processed. As discussed above, the ADC 110 can be a multi-mode DSC that can be useful in embedded systems, which require different digitization needs, one for each application and operate for different frequency bands.

Figure 2B:
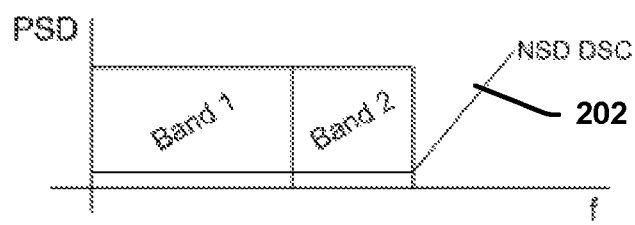

In one example illustrated in FIG. 2a, the DSC 110 processes two different signal bands 203 (Band 1 and Band 2), which can be different frequency ranges, in uplink or downlink, different carriers, different modes (e.g., carrier aggregation, legacy, multi-input multi-output, or the like), or the like, where both bands (Band 1 and Band 2) are non-overlapping of one anther. The DSC 110 can thus be used with a noise spectral density (NSD) as depicted in FIG. 2b. In the digital post-processing, where both bands can be distinguished, a high clock and high power consumption can be utilized even when band 2 is not used.

Figure 2C:
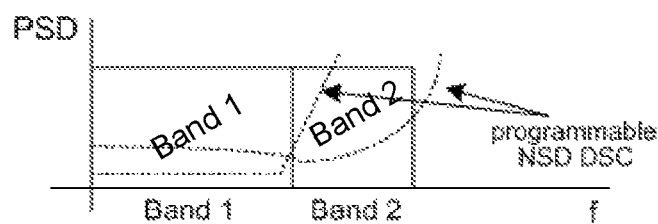
Figure 2D:
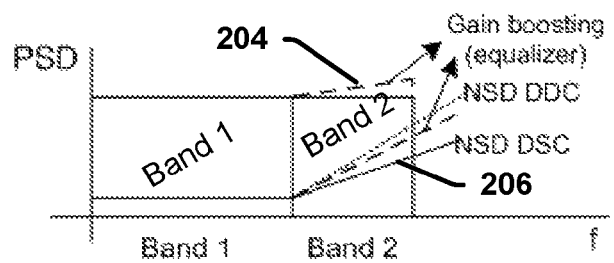

Another option is for the audio systems or devices being discussed herein (e.g., system 100) to utilize the DSC 110 as a programmable or reconfigurable DSC, as shown in FIG. 2c, which can be more power efficient useful if the requirements of the modes for different signal frequencies 204, or 206 are different.

Although sensors are discussed herein any signal generating device or signal receiving component can be utilized rather than a sensor component. In the case of sensors in particular, a solution implemented for MEMS microphones (e.g., system 100) and ultrasonic applications can also comprise current MEMS microphones having a 1-bit interface (e.g., the DDC 116) to the microcontroller (not shown) of the application, which utilizes a delta-sigma DDC 116 after a multibit DSC 110. The noise density of the DDC 116 usually dominates the noise density of the DSC (e.g., DSC 110). However, the ultrasonic frequencies can be corrupted by noise. The equalizer or boost component 114 can thus be utilized to not affect the audio band (Band 1 in FIG. 2d), and thus the performance of the MEMS microphone can be preserved. However, the digital equalizer or boost component 114 does not efficiently amplify the poorly digitized ultrasonic band (band 2 in FIG. 2d). As DDC noise is dominant, signal 206 is boosted over DDC noise to the signal level 204. This solution is suitable when the specifications of the different modes or frequencies are similar. The main drawback of this solution is that it is only useful if the system 100 has another source of noise that is dominant, as the noise injected by the DDC 116. If such DDC does not exist, the noise is also boosted and the effect of the equalizer is not visible. Moreover, the signal cannot be boosted indefinitely, because the DDC 116 can become severely overloaded.

Figure 2E:
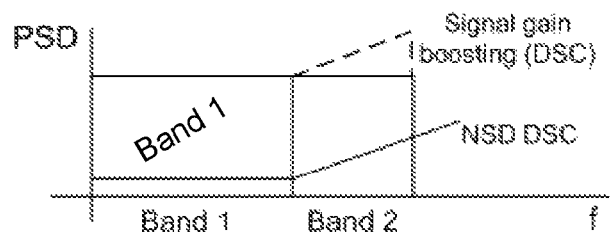

Referring to FIG. 2e, the two bands 203 illustrate a different boosting technique where only signal is equalized or amplified, and hence, DSC quantization noise is not compromised. In one embodiment, for example, the DSC 110 is configured to operate a different boosting or amplifying technique and architecture where only the signal, which can be selected from among one or more signals of different frequencies or operating bands being processed, is being amplified, while DSC quantization noise is not compromised or also being amplified.

Figure 3:
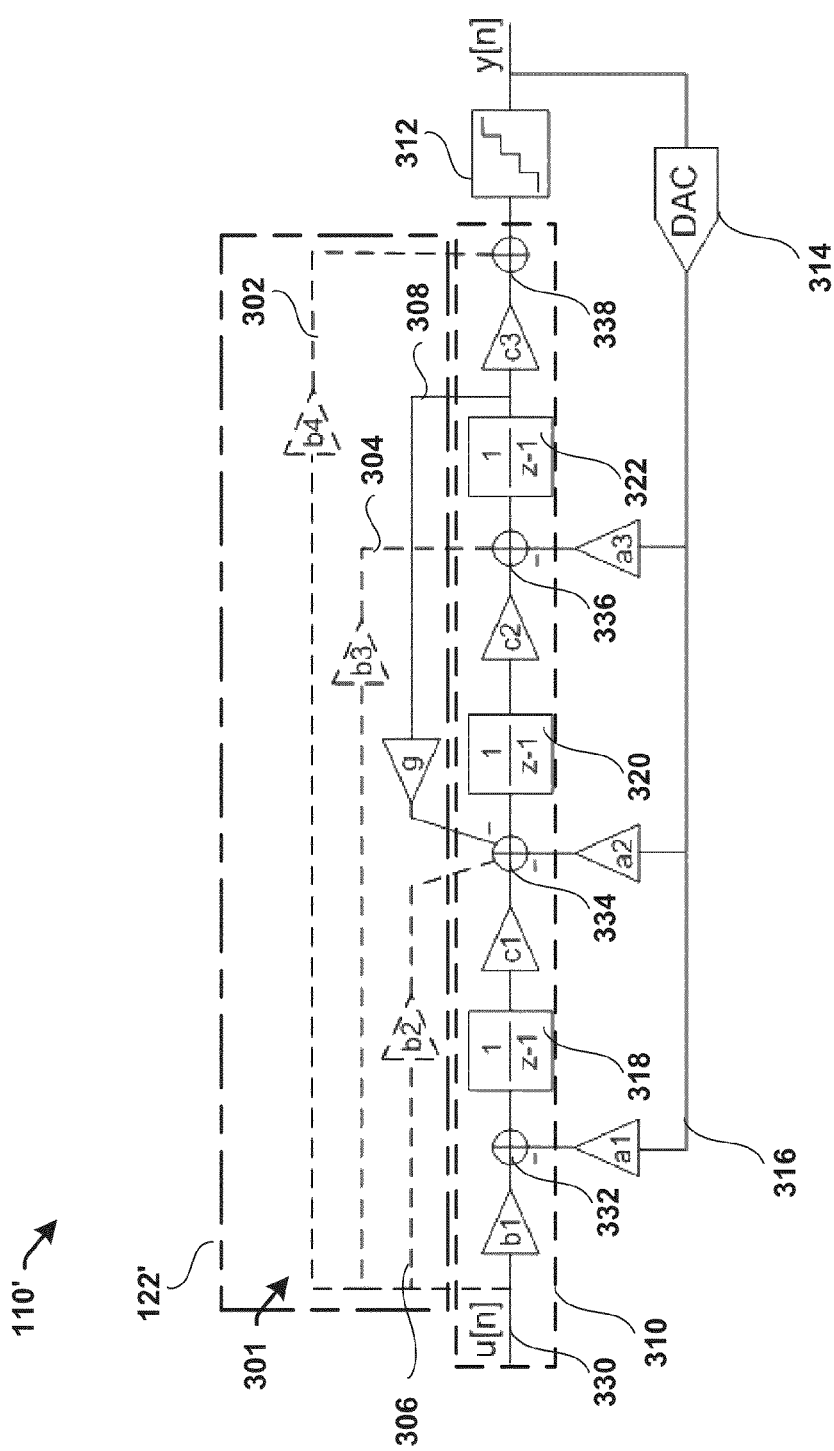
FIG. 3 is a block diagram illustrating an analog-to-digital converter in accordance with various aspects.

Referring to FIG. 3, illustrated is one example of an architecture of the ADC 110' as a DSC for amplifying at least one signal from among different signals or bands being processed by extending the bandwidth of the DSC 110'. The DSC 110' can comprise the gain component 122', a loop filter 310, a quantizer 312 and a feedback digital-to-analog converter (DAC) 314. The loop filter can include a cascade of integrators 318, 320 and 322, which can include switched-capacitor integrators or other integrators without switching components. Each of the integrators 318, 320 and 322 can further be coupled to one or more amplifiers $c_1$, $c_2$, and c3, for example, to further process the input signals and component parameters along the signal processing path 330.

In one embodiment, the ADC 110' can be considered a multiple feedback architecture, in which the ADC 1106 is the number correct?? comprises a feedback path 316 having the DAC 314 as a feedback component that provides a feedback analog signal, property, coefficient, or parameter a1, a2, and a3 to multiple different locations comprising the adders 332, 334, 336 and 338. The feedback path 316 receives a quantized digital signal from the quantizer 312 and generates an analog signal at multiple different points of along the signal processing path 330 through the loop filter 310. Although a third order DSC is illustrated with three integrators 318, 320, 322 and four adder components 332-338, the ADC 110' can include more or less integrators and the feedback path 316 can comprise additional points of insertion at additional adders or less depending upon the order of the loop filter 310.

In another embodiment, the denominator of a signal transfer function (STF) or noise transfer function (NTF) can be controlled according to the feedback parameters a1, a2, a3, for example. The parameters a1, a2, or a3 can be fixed or predetermined based on frequency, for example. Thus, the gain component 122' can increase a signal gain to amplify the operational bandwidth of the ADC'.

In another embodiment, the gain component 122' further comprises feed forward paths 302, 304, and 306, as well as a feedback path 308 having a coefficient of gain (g) coupled to the adder 334 at a second feedback path with coefficient a2. The input feedforward coefficients b1, b2, b3, and b4 are provided along the signal processing path 330 via the feedforward paths 302, 304, and 306, marked in a dashed line. More or less feedforward paths are envisioned herein so the number of paths is not limited.

The coefficients b1, b2, b3, and b4 are provided to the signal processing path 330 in feed forward paths 302, 304, and 306 in order to modify the signal itself and extend the operating bandwidth of the ADC 110' without modifying the noise or the NTF of the ADC 110' operations. Depending upon the order of the ADC 110', more or less paths can be activated, added or subtracted in operation along the signal processing path 330. Adding these branches modifies the properties of the ADC 110'. The addition of b4, for example, decreases the output swing of most of the integrators 318, 320, and 322, thereby relaxing their specification requirements. Coefficients b2 and b3 can be optimized to avoid STF peaking or saturating out of the bandwidth, which can cause overload.

In another embodiment, the additional branches are optimized to increase the bandwidth on the ADC 110', and thus enhance the capability of the ADC 110' for processing additional frequency bands. The ADC 110' can be linearized via the gain component 122', whereby the quantizer 312 is an additive block that injects uncorrelated quantization noise, e[n]. As such, the NTF and the STF can be defined as:

$$STF(z) = \frac{Y(z)}{U(z)}\bigg|_{E(z)=0} = \frac{H_1(z)}{1+H_2(z)} \quad (1)$$

$$NTF(z) = \frac{Y(z)}{E(z)}\bigg|_{U(z)=0} = \frac{1}{1+H_2(z)}$$

wherein Y(z) represents the numerator that is able to be modified according to the coefficients or parameter values provided via the coefficient components b1-b4 to affect the STF. The denominator U(z) is unaffected in defining the NTF when the STF is modified. The STF and the NTF can also be written in terms of two inputs U(z) and E(z), which is further discussed below with respect to FIG. 4.

Dashed coefficients b2, b3, and b4, for example, belong to $H_1(z)$, and hence they only affect the STF of the ADC 110'. This technique enables processing of frequency bands outside the bandwidth of the ADC 110', which is set/determined by the NTF. The gain component 122' thus enables a signal gain boosting or amplification in the loop filter that produces an extension of the bandwidth of the converter. In other words, the ADC 122' operates to modify its capabilities for processing multiple different signal frequency bands by extending the band for a signal while processing other signals concurrently or simultaneously operating at a different frequency band.

In another embodiment, the feed forward paths 302, 304, and 306 or the coefficients b2, b3, and b4 can be activated dynamically based on the operating band of the input signals being received at the signal processing path 330 of the loop filter 310. The gain component 122' can extend the bandwidth for a particular signal by activating one, two, three, or other number of feed forward paths or coefficient components by amplifying the input signal gain at certain frequencies for processing different frequency bands, while also preserving or preventing change of the NTF or noise of the ADC 110'.

For example, different coefficient components (e.g., b2-b4) can provide programmed or predetermined parameter values at different points along the signal processing path 330 to cause an increase in the signal-to-noise ratio of the ADC 110' with respect to a particular signal. The gain component 122' is thus configured to modify the signal transfer function of the delta-sigma converter to facilitate processing of the one of the input signals in a frequency band that is different from a previous signal of a previously processed frequency band, or another input signal being concurrently processed, by increasing a signal-to-noise ratio of the one of the inputs signals while maintaining a noise transfer function of the delta-sigma converter.

The gain component 122' of the ADC 110' can enables further advantages by operating with only passive components such as resistors and/or capacitors, connected at the input of the integrators in order to facilitate or form the coefficient components b1-b4, for example. Active components (e.g., active switching components, additional circuitry or the like) could also be implemented within the feed forward paths 302, 304, and 306 to implement the coefficients b2, b3, b4, etc., but are not required. The ability to alter the STF to extend the bandwidth of the ADC 110' via only passive component feed forward paths minimizes hardware overhead.

In the particular case of using the ADC 110' for a MEMS microphone that employs the DDC 116 of FIG. 1, which can be combined with the boost component 114, improved results can be obtained by adding coefficients to improve the signal gain via the feed forward paths and improve the signal and the noise gain out of the operating band even while the noise of the DDC is dominant. However, the operations of the gain component 122' can be applied to different digitization systems that utilize a DSC regardless of the kind of DSC: a discrete-time (DT), or a continuous-time (CT) DSC.

Figure 4:
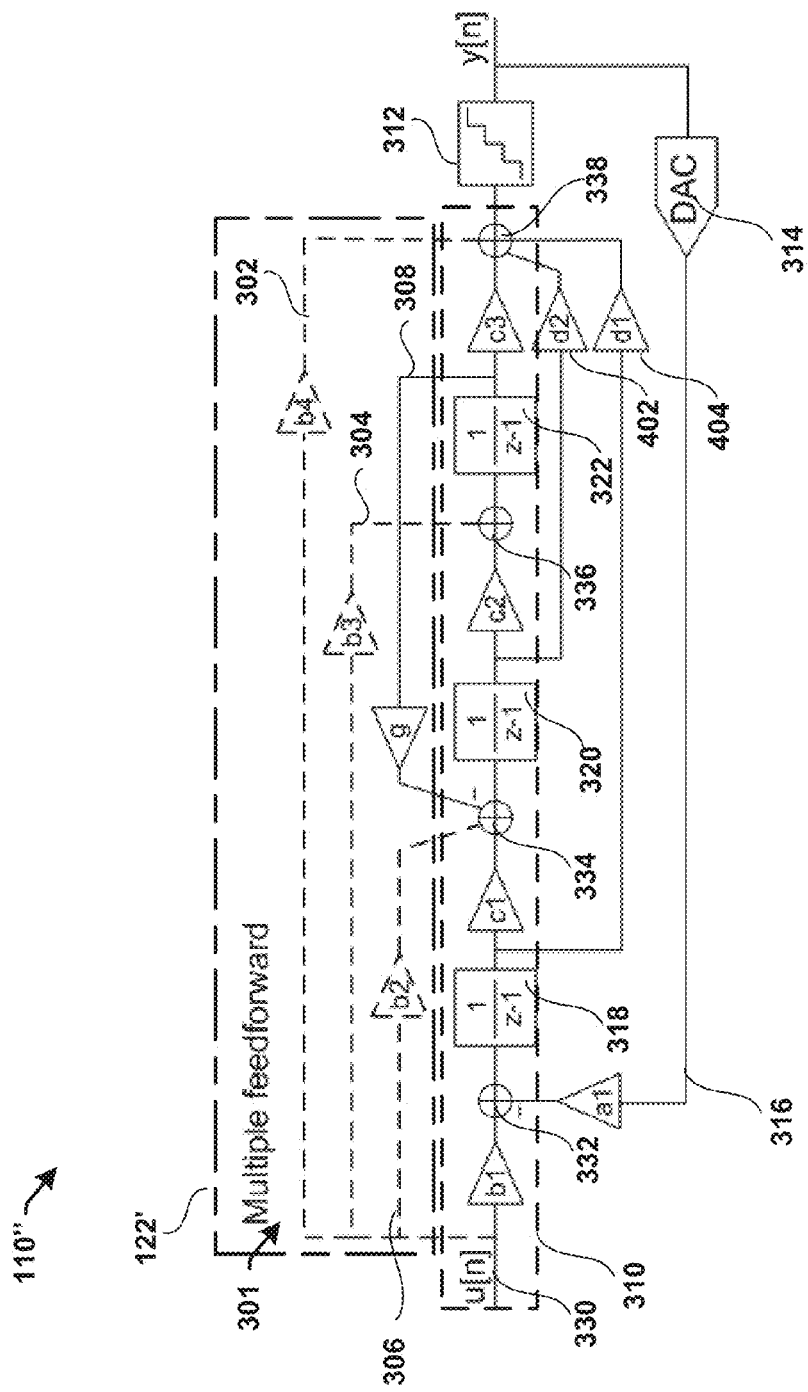
FIG. 4 is a block diagram illustrating another analog-to-digital converter in accordance with various aspects.

Referring to FIG. 4, illustrated is an example of an architecture of the ADC 110'' as a DSC for amplifying at least one signal from among different signals or bands being processed via the ADC 110' by extending the bandwidth of the DSC. The ADC 110'' can comprise similar components as in the figures above the gain component 122', a loop filter 310, a quantizer 312 and a feedback digital-to-analog converter (DAC) 314.

In one embodiment, the loop filter 310 can be a Multiple Input Single Output (MISO) linear subsystem, for example. Rather than having, multiple different feedback parameters a1-a3, only a1 is utilized to affect the NTF of the ADC 110". Additional, feed forward coefficients or parameters can be fixed as d1 402 and d2 404, for example. The inputs (e.g., u[n], coefficients b2, b3, or b4, d1 or d2, any combination thereof, or the like) of the loop filter 310 correspond to the DSC's input and the output of the DAC 314 (e.g., feedback path parameters a1, a2, a3, any combination thereof, or the like), whereas the output of the loop filter corresponds to the input of the quantizer 312. In this way, the loop filter 310 is composed by two transfer functions: $H_1(z)$ for input signal and $H_2(z)$ for feedback DAC 314.

The quantizer 314 converts the output of the loop filter to a digital code, and it is a non-linear element of the DSC. In order to approximate the DSC 110" by a linear model, the quantizer 314 can be modeled as an additive error source, represented as e[n], which can comprise a uniform distribution and is independent of the input signal.

The DAC 314 can be the only component placed in the feedback path 316 of a modulator or DSC. In most cases, the DAC 314 uses the same number of quantized levels as the quantizer 312 and converts the output of the quantizer 312 into an analog signal by using voltage or current sources (not shown) connected to the output y[n] of the loop filter 310. Modelling of the DAC 314 can assumed it as a unity gain stage for DT DSCs.

Regarding this, the output of the system, Y(z), can be written in terms of the two inputs U(z) and E(z) as follows:

$$Y(z) = \qquad (2)$$
$$STF(z) \cdot U(z) + NTF(z) \cdot E(z) = \frac{H_1(z)}{1+H_2(z)} \cdot U(z) + \frac{1}{1+H_2(z)} \cdot E(z)$$

The performance of the converter can be evaluated with the Signal-to-Noise Ratio (SNR) over the analog input bandwidth ($f_0$), illustrated further in FIGS. 5a-5b, and as follows:

$$SNR(dB) = 10 \cdot \log\left(\frac{P_{signal}}{P_{noise}}\right) \qquad (3)$$
$$P_{signal} = \int_{-f_0}^{f_0} S_{in}^2(f) \cdot |STF(e^{j2\pi f})|^2 df$$
$$P_{noise} = \int_{-f_0}^{f_0} S_e^2(f) \cdot |NTF(e^{j2\pi f})|^2 df$$

Considering an input sine wave covering the full scale voltage of the quantizer 312, and assuming an N-bit quantizer with Δ LSB voltage, equations (3) can be recomputed as (considering quantization noise only) as follows:

$$P_{signal} = \left(\frac{\Delta 2^N}{2\sqrt{2}}\right)^2 \int_{-f_0}^{f_0} |STF(e^{j2\pi f})|^2 df \qquad (4)$$
$$P_{noise} = \frac{\Delta^2}{12} \int_{-f_0}^{f_0} |NTF(e^{j2\pi f})|^2 df$$

As shown in the equations (4), SNR can be increased by optimizing NTF or by optimizing STF. This is further illustrated in FIGS. 5a-5b, for example. NTF can be controlled using a high-pass filter optimized to minimize the in-band noise power, while STF can be controlled with a low-pass filter. As both filters have the same poles, which is characteristic of the transfer functions that determine the system response characteristics, STF can be optimized outside of the NTF bandwidth to process a different signal band with enough SNR at a greater bandwidth. This is discussed above with respect FIG. 2 and represented in the FIGS. 5a-5b with the vertical axis of the graphs 502 and 504 expressing power levels in decibels and the horizontal axis representing frequency.

The gain component 122" operates to control STF to optimize the bandwidth based on the input signals needed operating band, while preserving NTF of the ADC 110" at the same time, which can be facilitate with the addition or activation (e.g., via switching components for direct coupling) of passive components to the loop filter 310. The feed forward paths or branches 302-306 shown in FIGS. 3 and 4, for example, can thus be passive and operate to only modify the STF numerator without affect to the NTF of the ADC 110". This can be demonstrated mathematically further below.

The decomposition of STF and NTF as defined in (1) can be analyzed further. Transfer functions $H_1(z)$ and $H_2(z)$ can be decomposed in numerator and denominator as follows:

$$H_i(z) = \frac{N_i(z)}{D_i(z)}; i = 1, 2 \qquad (5)$$

Figure 5B:
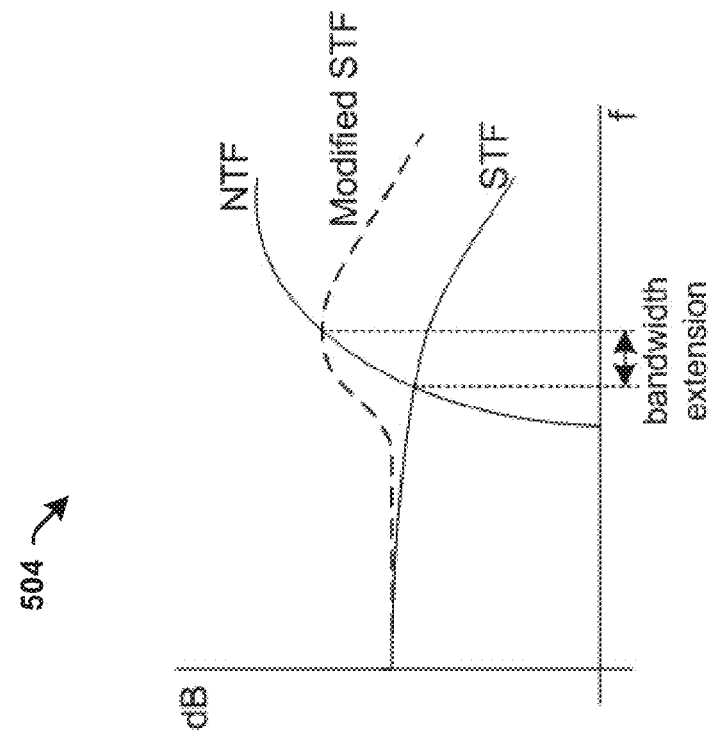
FIGS. 5a-5b are graphs illustrating a signal transfer function and noise transfer function without and with extension of a bandwidth for a signal band according to various aspects described.

Taking into account equations (1), (5) and that $d_1(z)=d_2(z)=D(z)$ as is shown in FIG. 5B, STF and NTF can be expressed as follows:

$$STF(z) = \frac{N_1(z)}{D(z) + N_2(z)} \qquad (6)$$
$$NTF(z) = \frac{D(z)}{D(z) + N_2(z)}$$

As we can see, the poles of both transfer functions (STF and NTF) are the same, while the zeros depend on $N_1(z)$ in the STF and on D(z) in NTF. The gain component 122" of the ADC 110" discussed herein enables a modification of the zeros of the STF to obtain a gain boosting of a signal being processed or received at an input of the signal processing path 330. This modification can be done by modifying the numerator $N_1(z)$, while keeping NTF, as can be appreciated with equation (6).

Figure 5A:
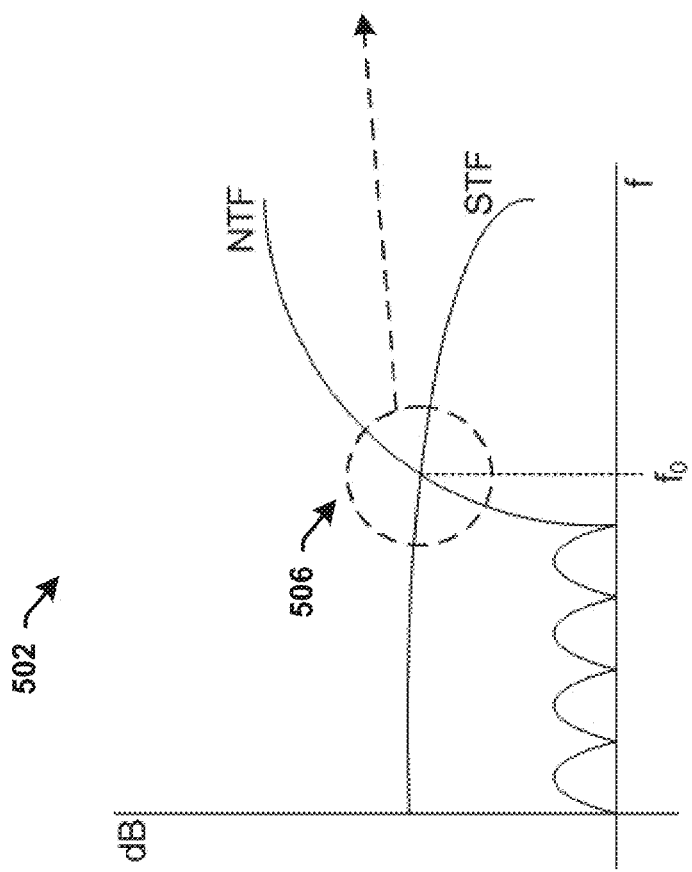

The graphs 502 and 504 of FIGS. 5a-5b illustrate that the ADC 110 or DSC of the systems described herein with the NTF and STF illustrated as solid curves. In this case, the NTF can be a high-pass filter and STF can be a low-pass filter, as described above. Due to the NTF, noise can be shifted to frequencies much higher than the analog bandwidth, $f_0$. In this way, signals that are out of this band can be covered or masked by noise, as occurs with signals in the ultrasonic band, for example, and the SNR in this case will be very poor. On the other hand, STF is almost flat in all the bandwidth, and therefore the signal being processed is not modified.

However, the zoomed portion 506 around the input signal bandwidth $f_0$ is illustrated in FIG. 5b with the dashed lined curve as the new modified STF that is generated by the gain component 122 via the feed forward paths 302-306 by adding coefficients $b_i$ (b2-b4). Thereby, the noise out of the band does not cover or mask the signal because it has been amplified due to the STF without the noise also being amplified or increased. Consequently, a bandwidth extension and an improved SNR for signals in the ultrasonic band or other frequency bands.

Regarding both architectures of FIGS. 3-4, with multiple feedback and multiple feedforward architectures, respectively, the following non-linear dependency can be obtained between polynomials $N_1(z)$, $N_2(z)$, $D(z)$ and the coefficients of the DSC 110, for example:

$$N_1(z) = f(b_i, c_i, g, d_i)$$

$$N_2(z) = f(a_i, c_i, g, d_i); \ i=1,2,3 \ldots$$

$$D(z) = f(g, c_i) \quad (7)$$

According to equations (7), the gain component 122 can modify the zeros of the STF without modifying the NTF by adding or changing coefficients $b_i$. The poles and zeros of a transfer function (e.g., NTF or STF) can be the frequencies for which the value of the denominator and numerator of the transfer function becomes zero respectively. The values of the poles and the zeros and the zeros of the system 100 or the ADC's described of the systems determine whether the system is table, the behavior and how well the performance is. This results in adding passive paths from the input node to each integrator 318-322 and to the last adder, as it is shown at system level in dashed line of FIGS. 3-4.

Referring now to FIGS. 6-13, illustrated are graphs of properties related the delta-sigma converter or ADC described herein. A second order DSC 110 with a feedback structure 316 and a 4-bit quantizer (e.g., quantizer 312).

Figure 6:
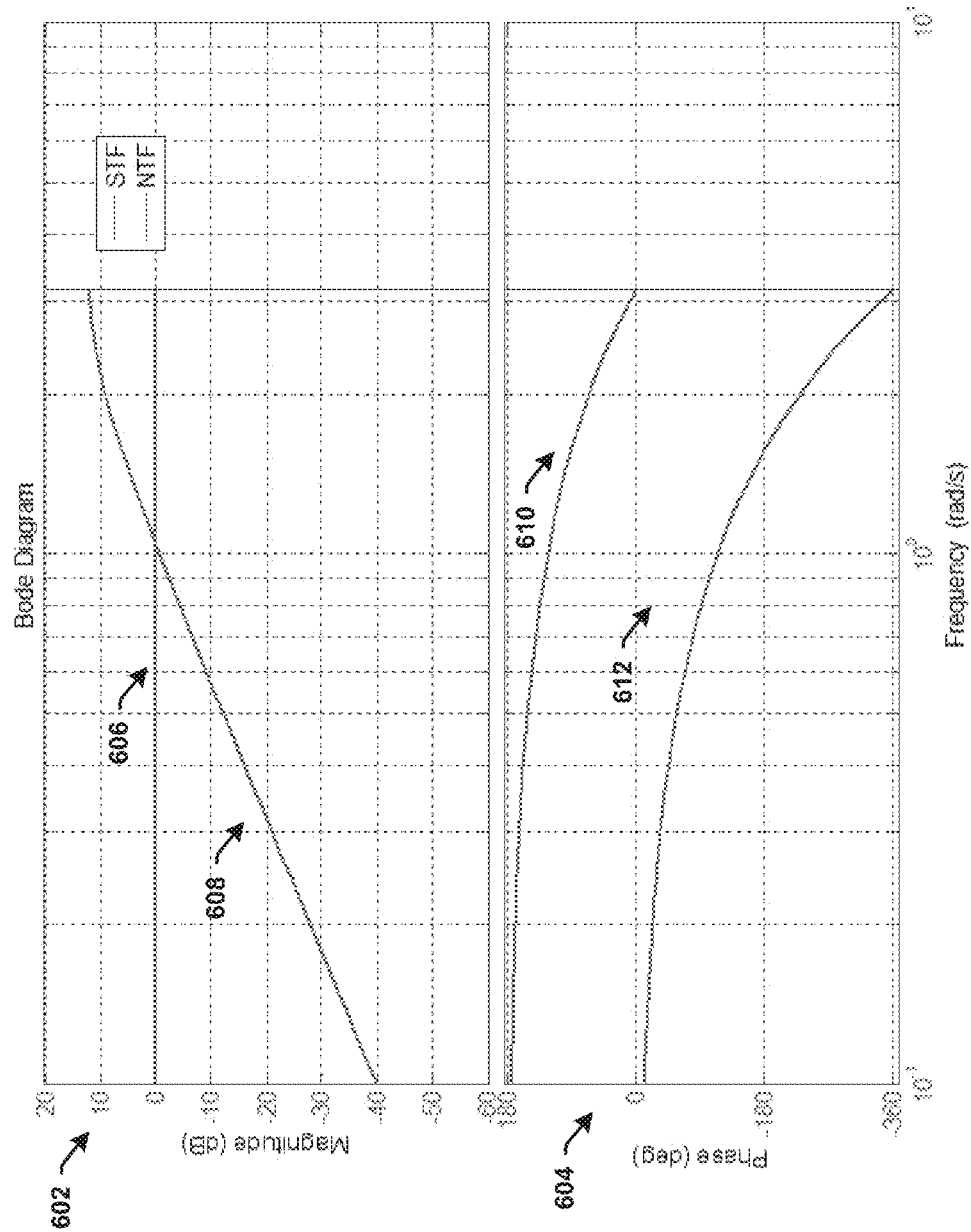
FIG. 6 illustrates a magnitude and phase frequency response of the signal transfer function and noise transfer function for an example second order DSC before an extension.

Referring to FIG. 6, a system level example is illustrated of a DSC before an extension of an operating bandwidth. With the purpose of simplifying the calculations, a second order DSC 110, which can be implemented as the DSC 110' and 110" with a feedback structure and a 4-bits quantizer, is described as an example. For this DSC, NTF and STF can be expressed as $$STF(z) = \frac{1}{z^2} \quad (8)$$

$$NTF(z) = (1 - z^{-1})^2 = \frac{(z-1)^2}{z^2}.$$

Figure 7:
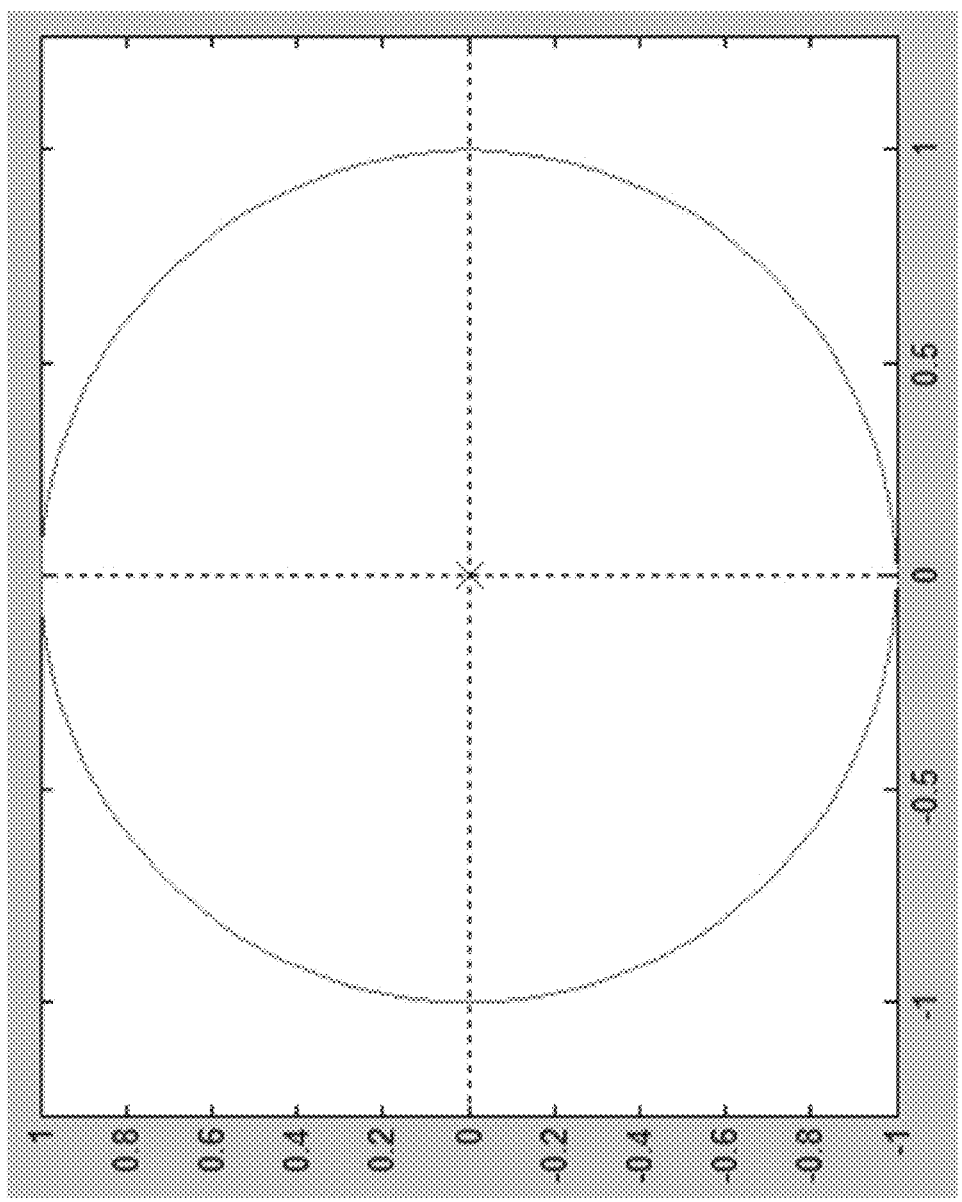
FIG. 7 illustrates a pole-zero diagram for the signal transfer function for an example second order DSC before an extension in accordance with various aspects.
Figure 8:
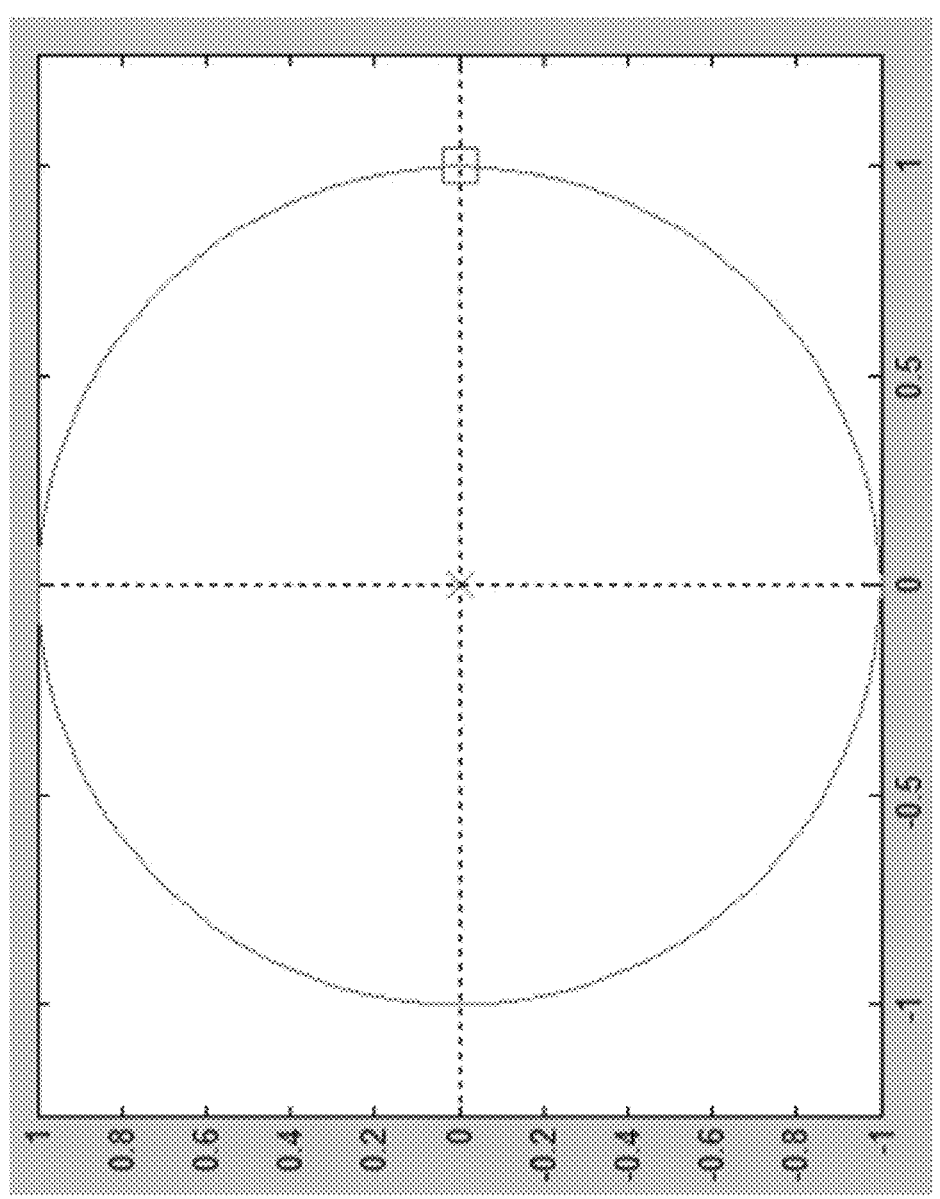
FIG. 8 illustrates a pole-zero diagram for the noise transfer function for an example second order DSC before an extension in accordance with various aspects.

Referring to FIG. 6, illustrated are bode diagrams 602 and 604 for magnitude in decibels (dB) and phase in degrees (deg). The magnitude and phase frequency response of both transfer functions (STF and NTF) can be seen as transfer functions with the STF curves 606 and 610, and NTF curves 608 and 612, respectively with respect to frequency (rad/s). The sampling frequency ($f_s$) can be equal to 1. The magnitude of STF can be shown as flat, in which the NTF can be utilized as a high-pass filter with a slope of 40 dB/decade, due to the second order loop filter. FIGS. 7-8 illustrate simulations with plots of the respective zero-pole diagrams in a unit circle. FIG. 7 illustrates a pole-zero diagram for the signal transfer function for an example second order DSC before extension. FIG. 8 illustrates a pole-zero diagram for the noise transfer function for an example second order DSC before extension.

Figure 9:
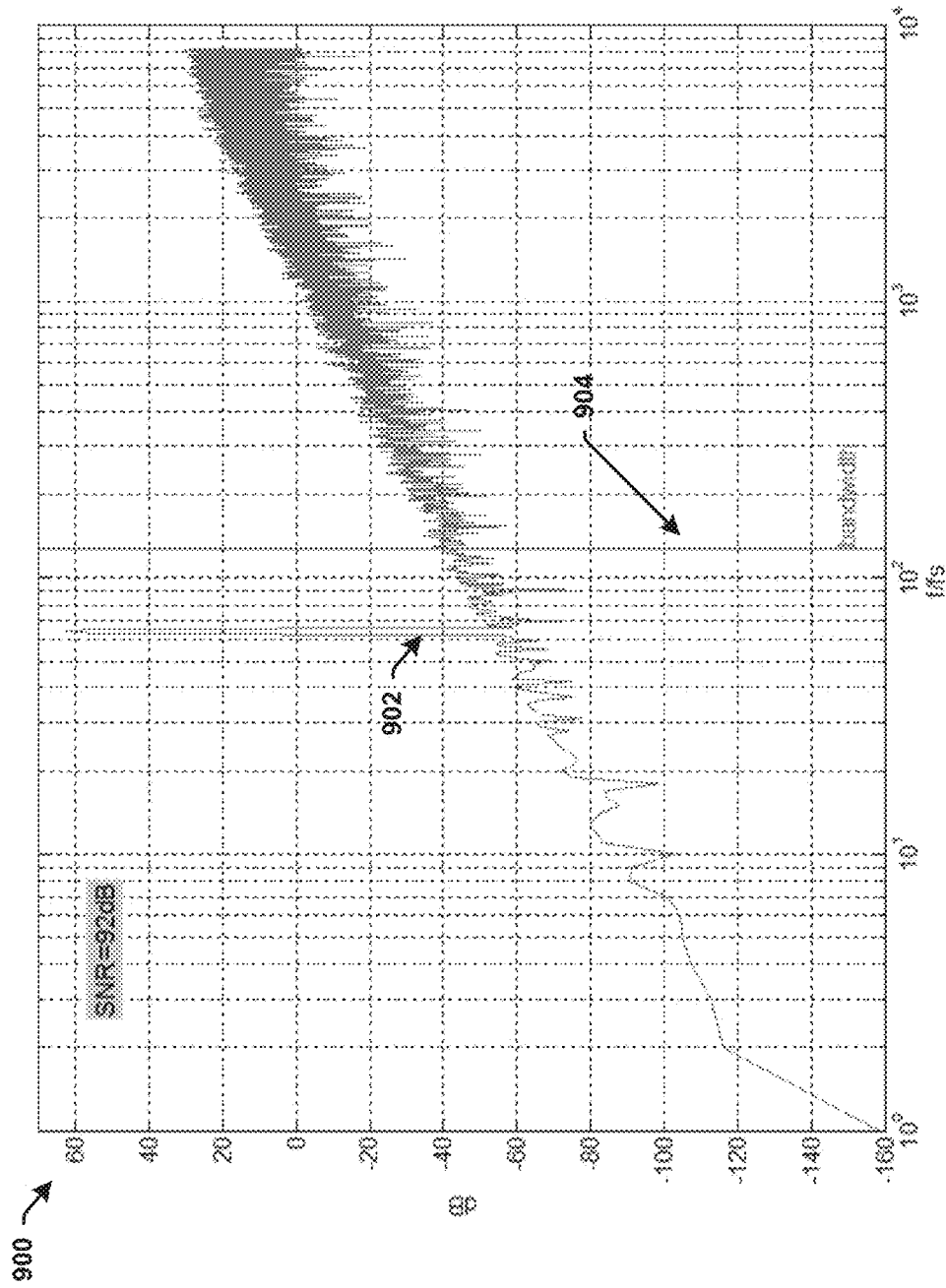
FIG. 9 illustrates a spectrum of the second order DSC in accordance with various aspects.

Referring to FIG. 9, illustrates a graph 900 of a spectrum 902 obtained at the output of the ADC. The second order ADC can be simulated, in which this DSC is for an input tone of −10 dB full-scale, and a frequency is approximately in the middle of the bandwidth 904 and has an oversampling ratio (OSR) of 64. The spectrum 900 obtained has the input tone and the noise with a slope of 40 dB/decade, as in the representation of the NTF. The calculated SNR for this simulation is a value of 92 dB, for example.

Figure 10:
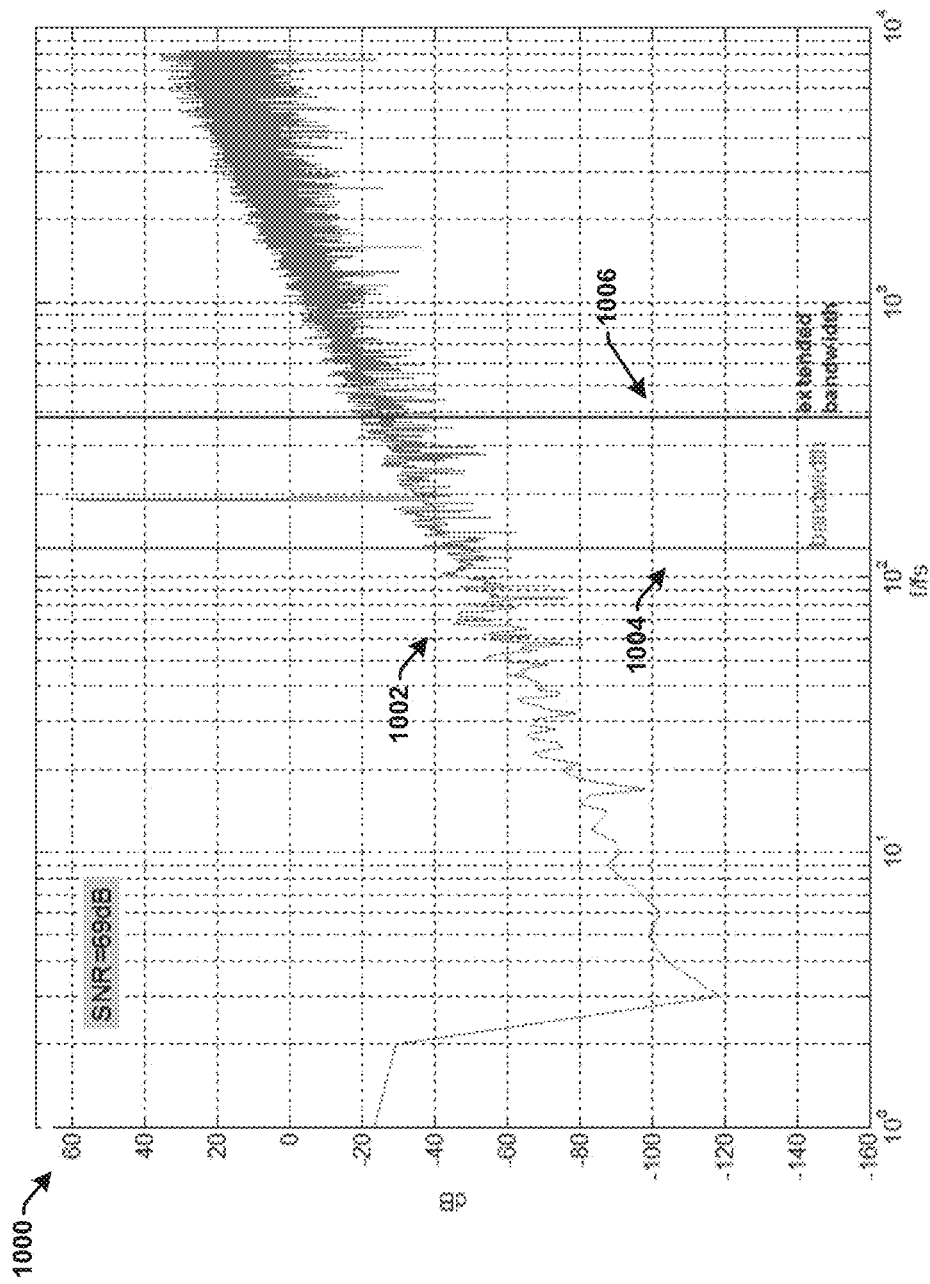
FIG. 10 illustrates a spectrum of the second order DSC after being extended nearly three times from previous processing operations in accordance with various aspects.

Referring to FIG. 10, illustrated is graph 1000 of a spectrum 1002, for example. The increase of the bandwidth at a frequency 1004 to a frequency 1006 is approximately three times. A simulation with a −10 dB full-scale tone in the middle of this new bandwidth 1006 provides the spectrum 1002 and a SNR of 69 dB. This resulting spectrum 1002 is not optimal however because of the noise at high frequencies due to the shape of the NTF, as the NTF is optimized for a smaller bandwidth. However, the gain component 122 of the ADCs described herein is configured to add coefficients $b_2$ and $b_3$, and thus increase the power of the signal being processed through the STF without modifying the NTF. In this way, the DSC 110, 110' and 110" can operate to process tones or frequency bands within the initial bandwidth, because the STF is preserved in this band, and the SNR can be improved in the new and larger bandwidth, where the STF is also increased.

Figure 11:
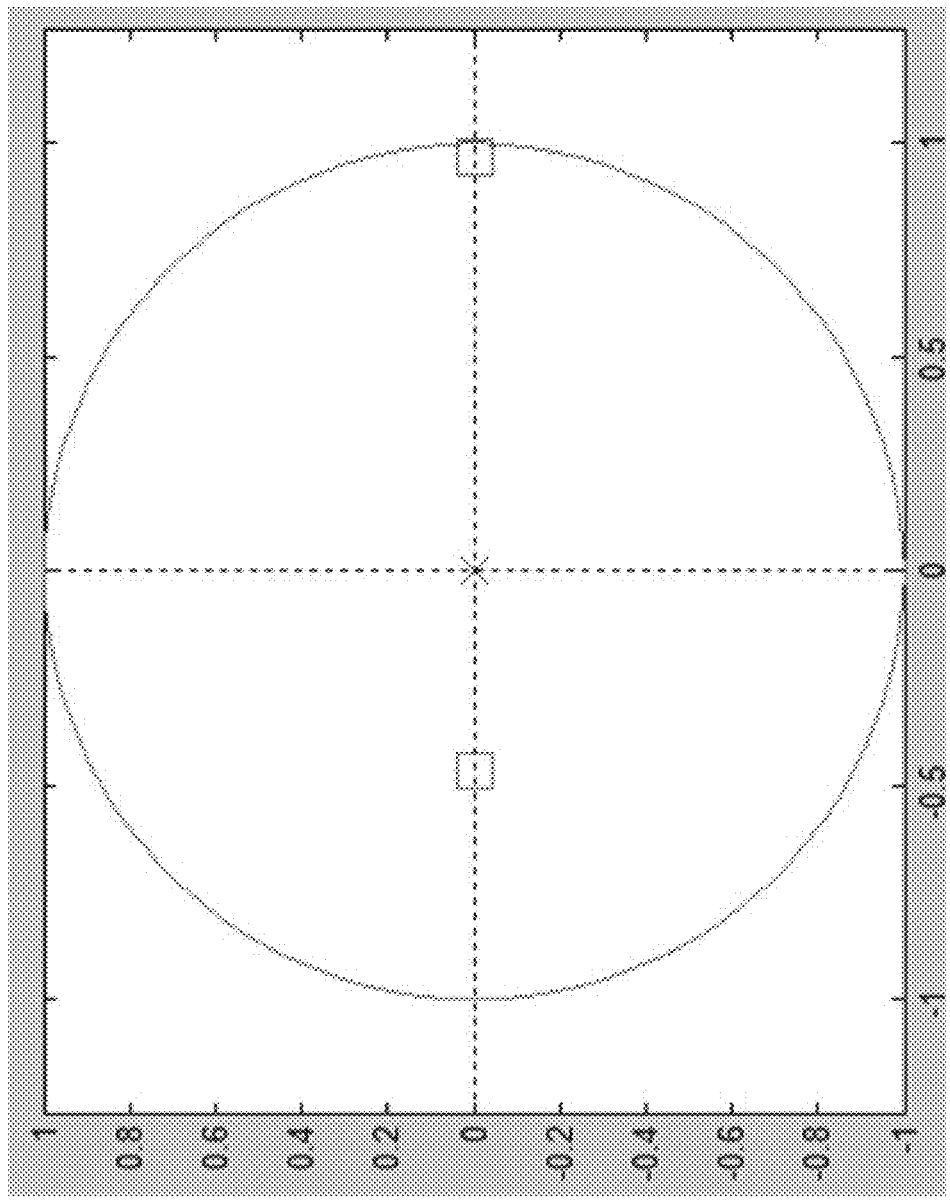
FIG. 11 illustrates a pole-zero diagram for the signal transfer function for an example second order DSC after being extended nearly three times from previous processing operations in accordance with various aspects.

The coefficients $b_2$, $b_3$, or others can be added via the gain components 122, 122' or 122" such as, for example, with values of 30 and 20 respectively. The ADC 110 or the systems 100, 300 or 400 can generate calculations to obtain the STF, with different zeros-pole mappings as illustrated in FIG. 11, which illustrates further simulations with plots of the respective zero-pole diagrams in a unit circle. The NTF for a bandwidth extension of the DSC bandwidth is still the same as in standard DSC:

$$STF(z) = \frac{20 \cdot (z - 0.9659) \cdot (z + 0.4659)}{z^2} \quad (9)$$

$$NTF(z) = \frac{(z-1)^2}{z^2}$$

Considering equation (9) above, two new zeros to the STF and a gain are added to alter the STF, but maintain or preserve the NTF. The NTF can be exactly the same as in a standard operation of a DSC, as in equation (8), without a bandwidth extension having been activated.

Figure 12:
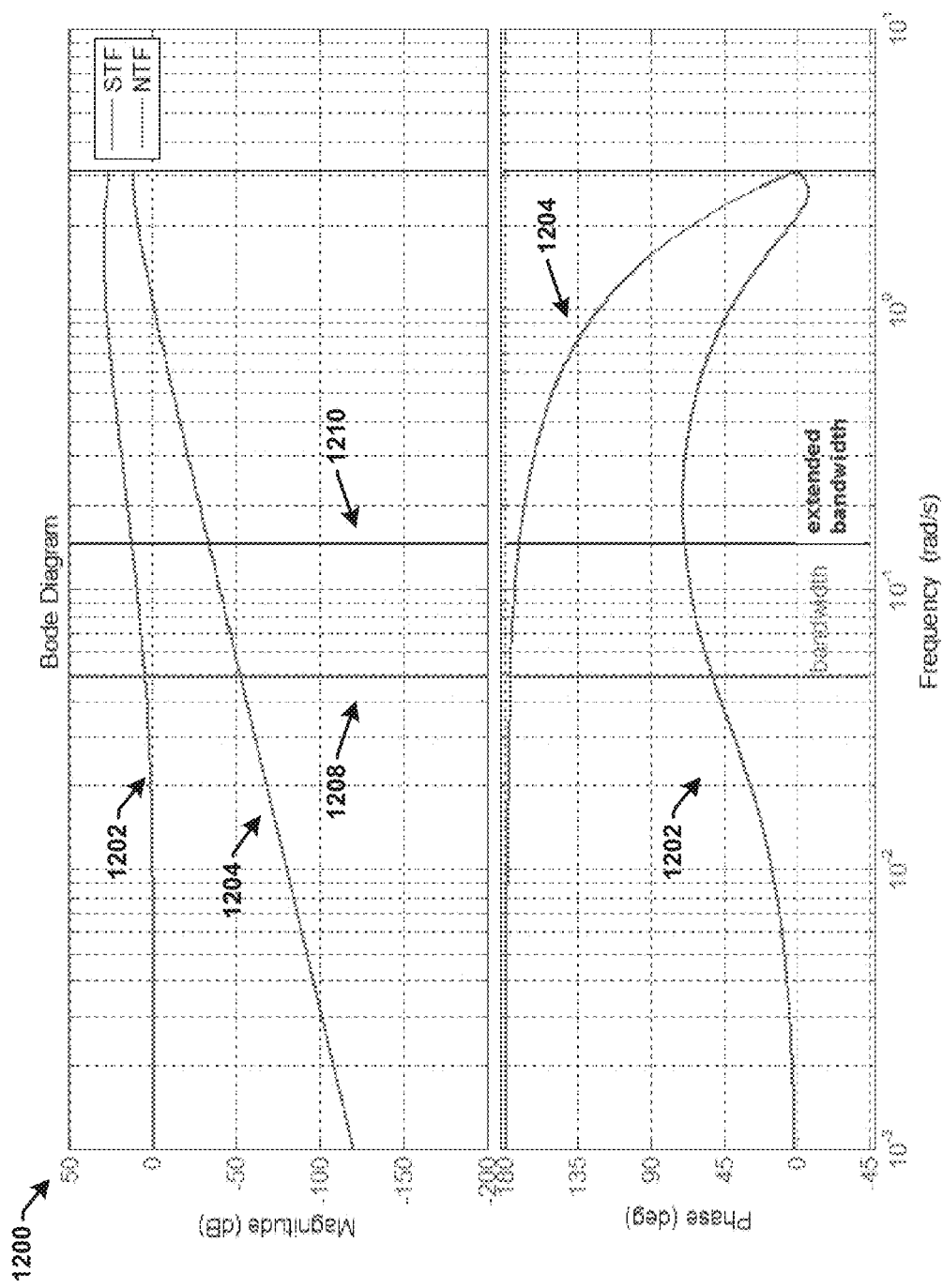
FIG. 12 illustrates magnitude and phase frequency responses for the signal transfer function and noise transfer function of an example second order DSC after being extended nearly three times from previous processing operations in accordance with various aspects.
Figure 13:
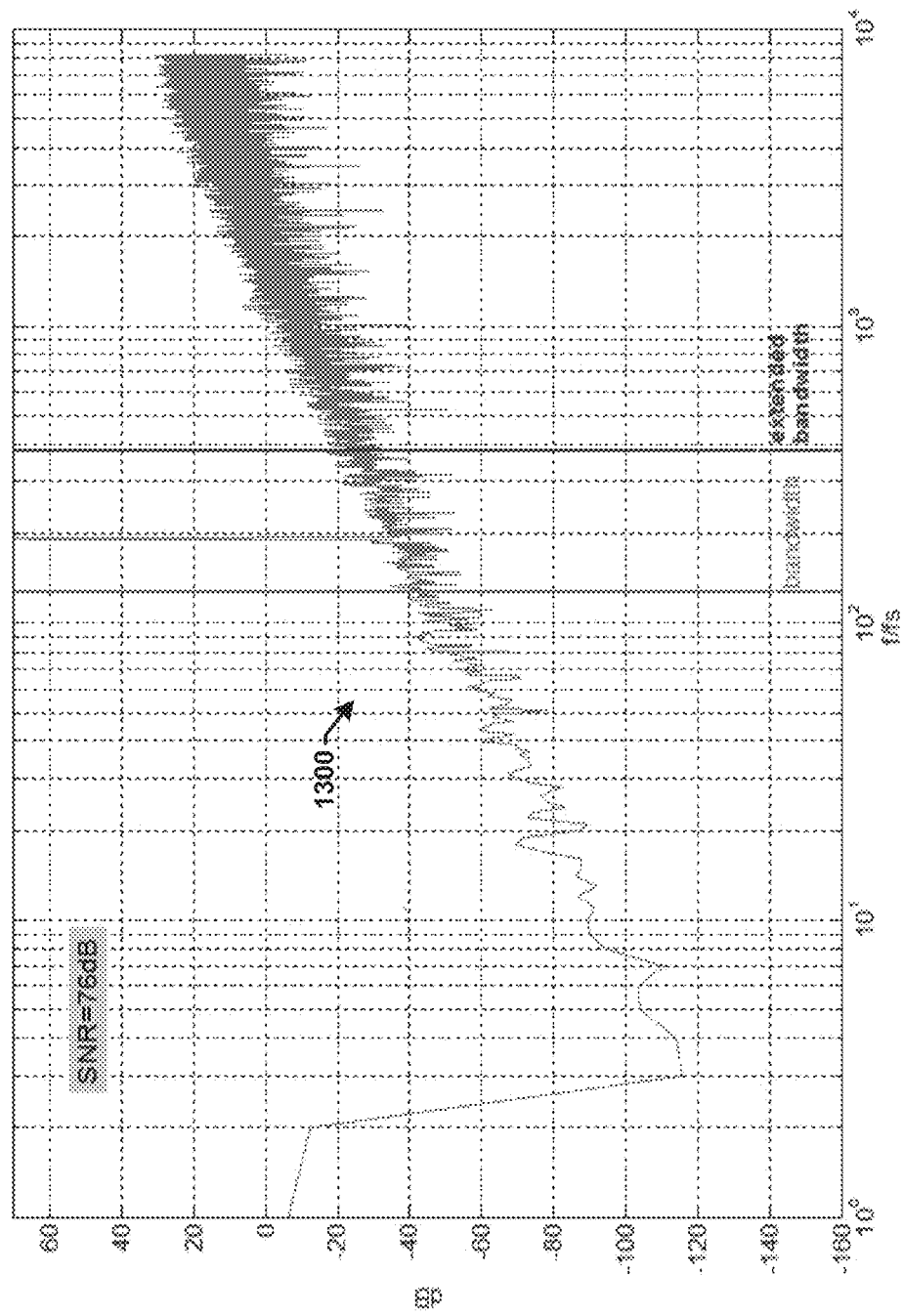
FIG. 13 illustrates a spectrum of the second order DSC after being extended nearly three times from previous processing operations in accordance with various aspects.

Referring now to FIG. 12, are graphs 1200 for the magnitude and phase frequency responses of the STF 1202 and the NTF 1204, respectively. The magnitude of the STF 1202 can increased via the gain component 122 at high frequencies due to the additional zeros being provided in the transfer function via the introduction of additional coefficients b2-b4. Repeating the simulation as discussed before, with a −10 dB full-scale frequency in the middle of the bandwidth 1208, for the extended bandwidth 1210 in the DSC 122 the spectrum 1300 of FIG. 13 can be seen and an SNR of 76 dB, which is more than 6 dB higher than the one obtained with the standard DSC spectrum without an extension or modification. In addition, the state variables of the transfer function can be taken into account in order to not saturate the DSC or ADC 110. Thus, coefficients of the DSC 110 can be scaled to optimize the state variables, with more emphasis and attention to a particular signal or case to the modification of the STF without modifying the NTF.

Figure 14:
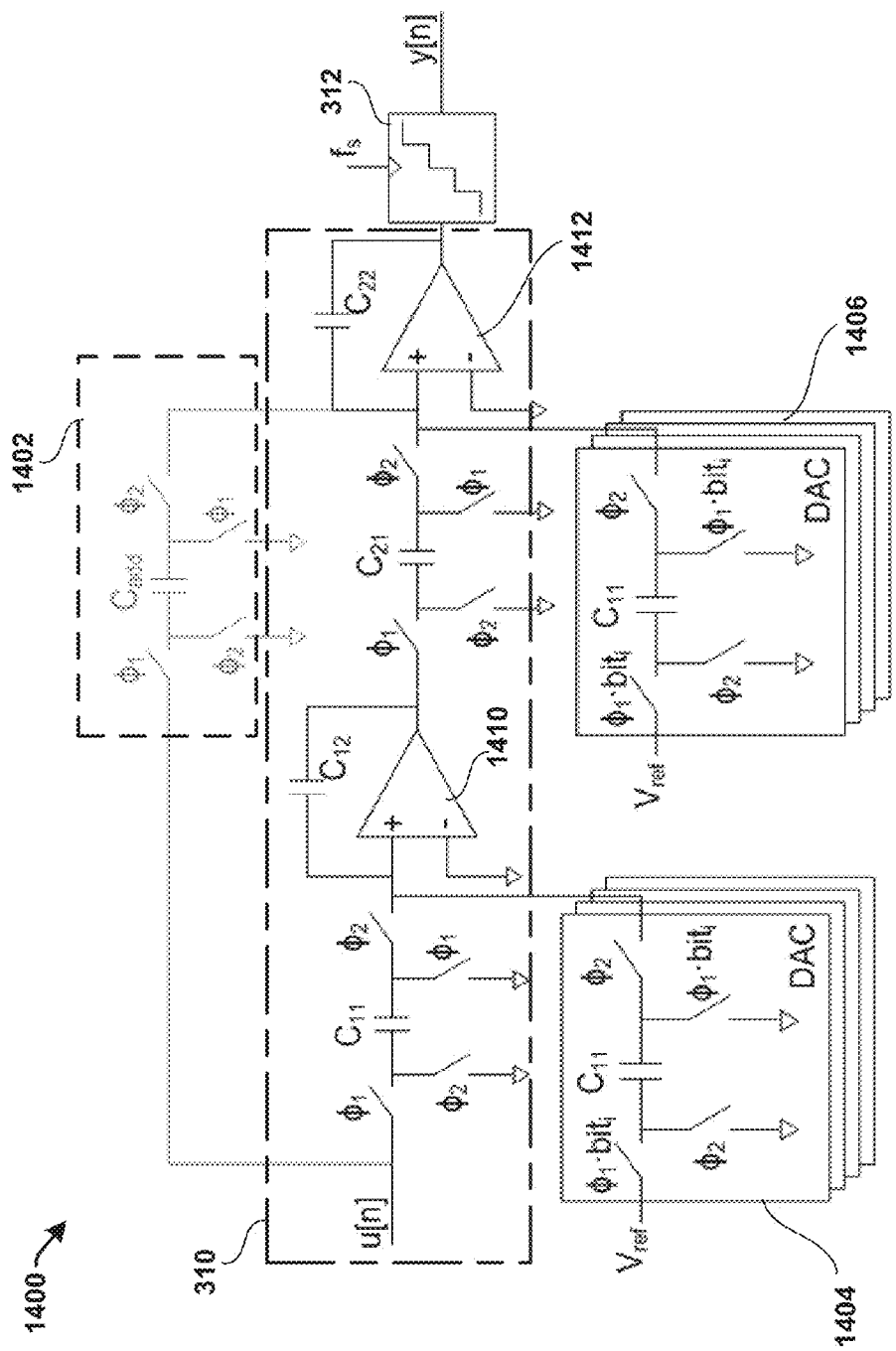
FIG. 14 is a block diagram illustrating another example discrete time delta-sigma converter in accordance with various aspects.

Referring to FIG. 14, illustrated is an example delta-sigma analog-to-digital converter 1400 in accordance with various aspects described herein. The ADC 1400 can represent the ADC 110, 110' or 110" and be a discrete or continuous DSC. For example, the ADC 1400 can be a discrete time delta sigma converter (DT DSC). In one embodiment, it can be implemented using switched-capacitor circuits such, which comprises two switched-capacitor integrators and the quantizer 312. A first switched-capacitor integrator can comprise the amplifier 1410 with capacitor $C_{12}$, and a second switched-capacitor integrator can comprise the amplifier 1412 with the capacitor $C_{22}$, in which each comprise different sets of switches $\phi_1$ and $\phi_2$. Additional switched-capacitor integrators can also be envisioned depending on the order of the loop filter 310.

The feedback path of the ADC 1400 can include one or more groups of DACs 1404 and 1406. Each DAC 1404 and 1406 can be controlled by a reference voltage as an active component and be controlled respectively by sets of switches $\phi_1$ $bit_i$ and $\phi_2$.

The ADC 1400 can activate or add forward paths with coefficients $b_2$ and $b_3$, for example, in different architectures. For example, an addition in a current value can be provided to the second integrator comprising the amplifier 1412, the capacitor $C_{22}$ and the switches $\phi_1$ and $\phi_2$ controlling $C_{21}$. In this case, the ratio between $C_{add}$ and $C_{22}$ imposes the value of coefficient $b_2$.

The gain component 1402 can thus comprise a plurality of feedforward paths 301 comprising coefficient components b2-bi, such as coefficient component $C_{add}$ of gain component 1402, which are configured in parallel to the portions of the loop filter to provide different coefficients along different locations of the signal processing path 330 of the loop filter 310, as shown in FIGS. 3-4. The number of feedforward paths 301 can correspond to a polynomial order of the loop filter 310. The different locations of the signal processing path 330 that receive the coefficients comprise active integrators (e.g., the first and second switched-capacitor integrators) respectively coupled to one another along the signal processing path. The gain component 1402 can be implemented with one or more feed forward paths 301 configured to increase a signal gain of the signal transfer function of the delta-sigma converter 1402 to increase the bandwidth for processing the one of the electrical signals in a higher frequency band than another frequency band of other electrical signals processing via the delta-sigma converter. The gain component 1402 can comprises a plurality of passive or active pathways to boost a frequency band from among frequency bands of different frequency ranges to be processed concurrently while maintaining a noise level as substantially unaffected.

Figure 15:
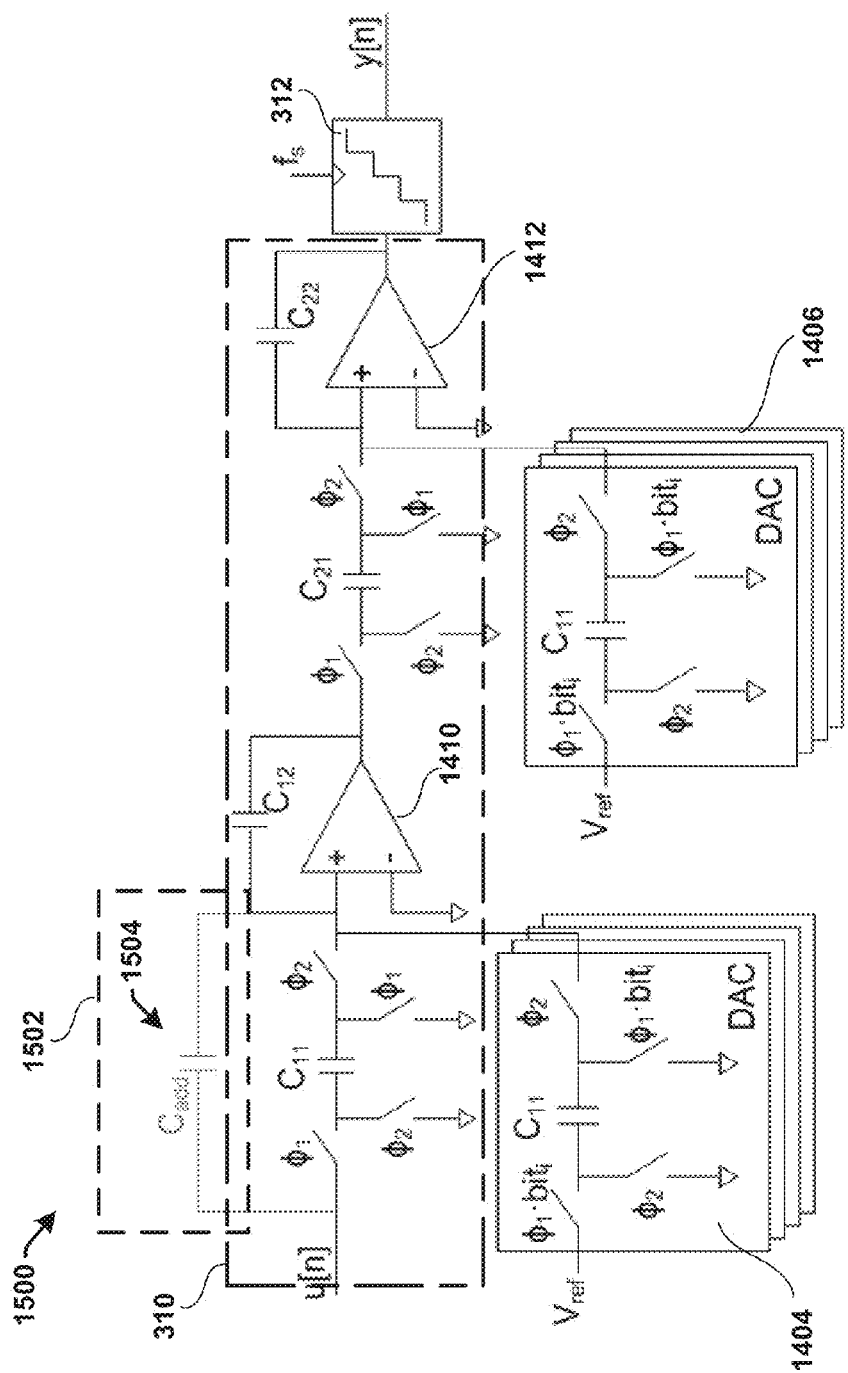
FIG. 15 is a block diagram illustrating another example discrete time delta-sigma converter in accordance with various aspects.

Referring to FIG. 15, illustrated is another example delta-sigma analog-to-digital converter 1500 in accordance with various aspects described herein. The architecture is similar to the ADC 1400 of FIG. 14. However, an addition in voltage is provided to the first integrator. In this case, coefficient $b_2$ is obtained in a different way. The ratio between $C_{add}$ 1504 of the gain component 1502 and $C_{12}$ imposes the value of $b_2/c_1$ (see, supra, FIGS. 3 and 4).

Figure 16:
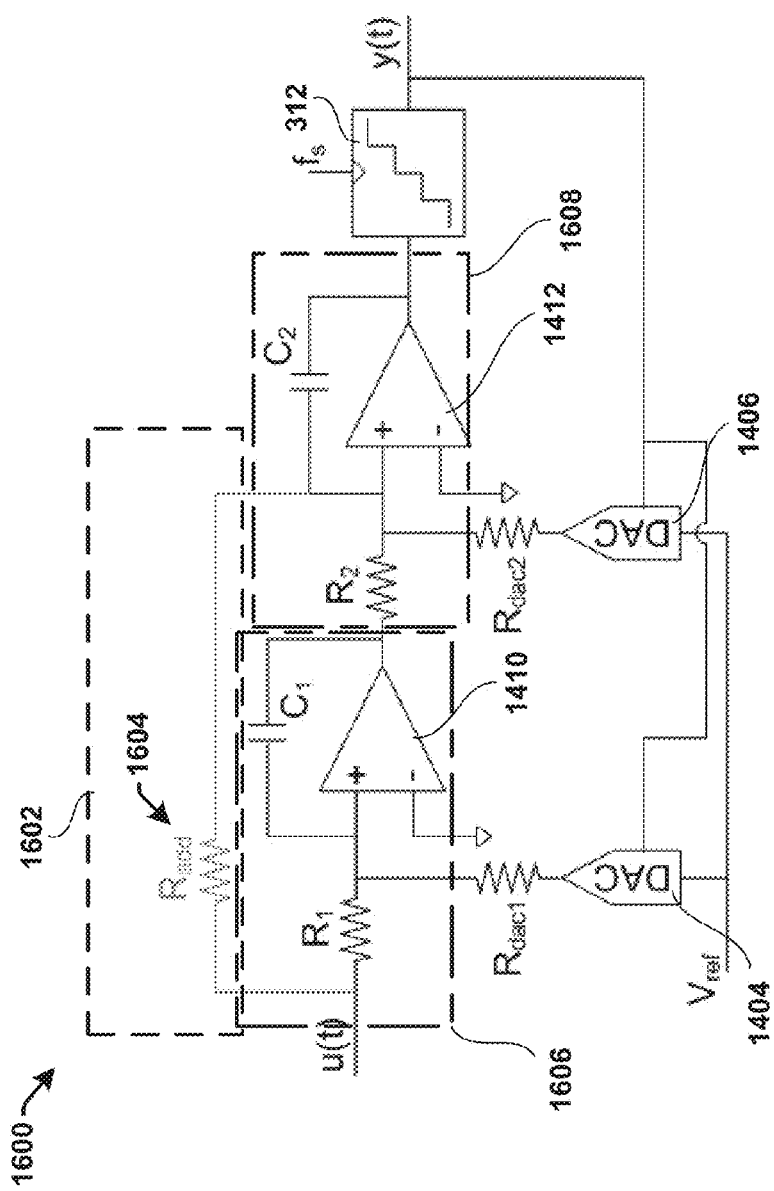
FIG. 16 is a block diagram illustrating another example continuous time delta-sigma converter in accordance with various aspects.

Referring to FIG. 16, illustrated is another example delta-sigma analog-to-digital converter 1600 in accordance with various aspects described herein. As discussed above, the proposed techniques could be used in different kinds of DSCs. By way of further example, the ADC or DSC 1700 can be configured as a continuous time delta sigma converter (CT DSC). As discussed above regarding the DT DSC 1400 and 1500, there are two ways of implementing the new coefficients. FIG. 16 illustrates the case where a new resistor, $R_{add}$, 1604 in a gain component 1602 is used to add in current or a coefficient value to a second integrator 1608 coupled to a first integrator 1606. In this case, the value of $b_2$ is fixed by $R_{add}$ and $C_2$. $R_{dac1}$ and $R_{dac2}$ can represent resistors of corresponding DACs 1404 and 1406 being feedback to provide feedback values that are fixed.

Figure 17:
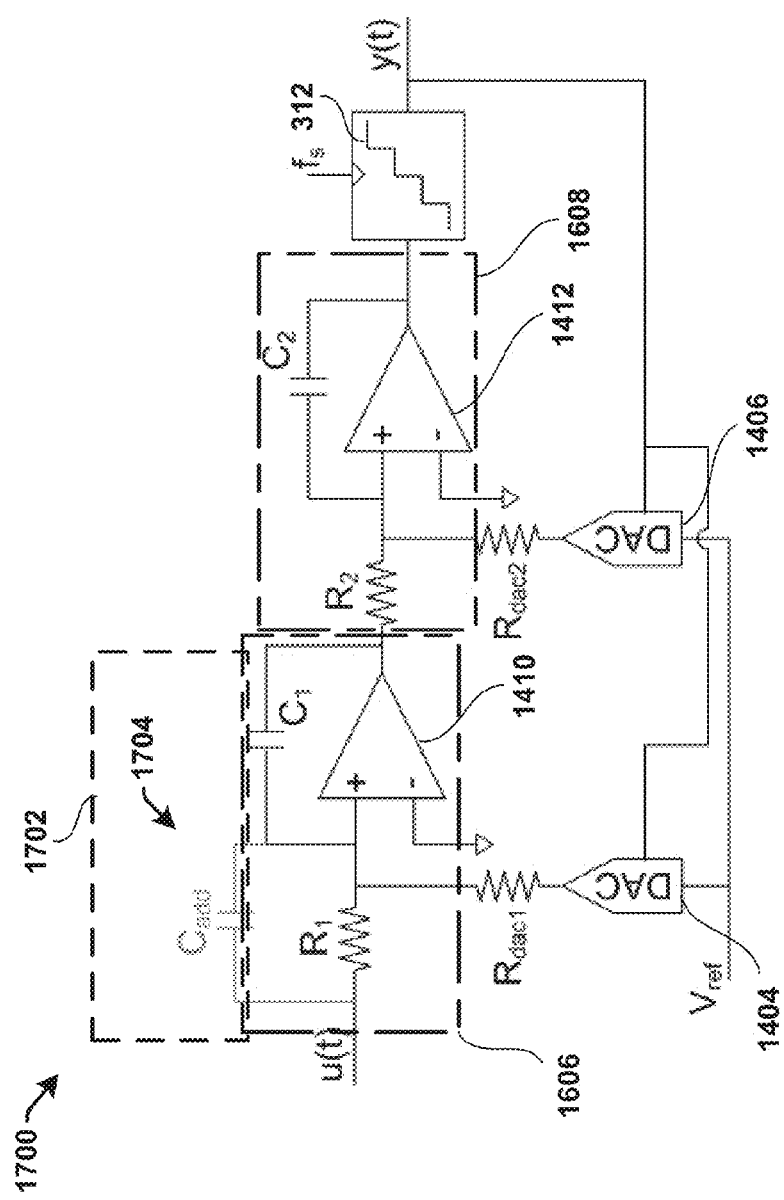
FIG. 17 is a block diagram illustrating another example continuous time delta-sigma converter in accordance with various aspects.

Referring to FIG. 17, illustrated is another example delta-sigma analog-to-digital converter 1700. The DSC 1700 is similar in aspects to the DSC 1600 of FIG. 16, but further illustrates the case where a new capacitor, $C_{add}$, 1704 of a gain component 1702 is provided to add in voltage to the first integrator 1606. In this case the value of $b_2/c_1$ is fixed by $C_{add}$ and $C_1$.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 18:
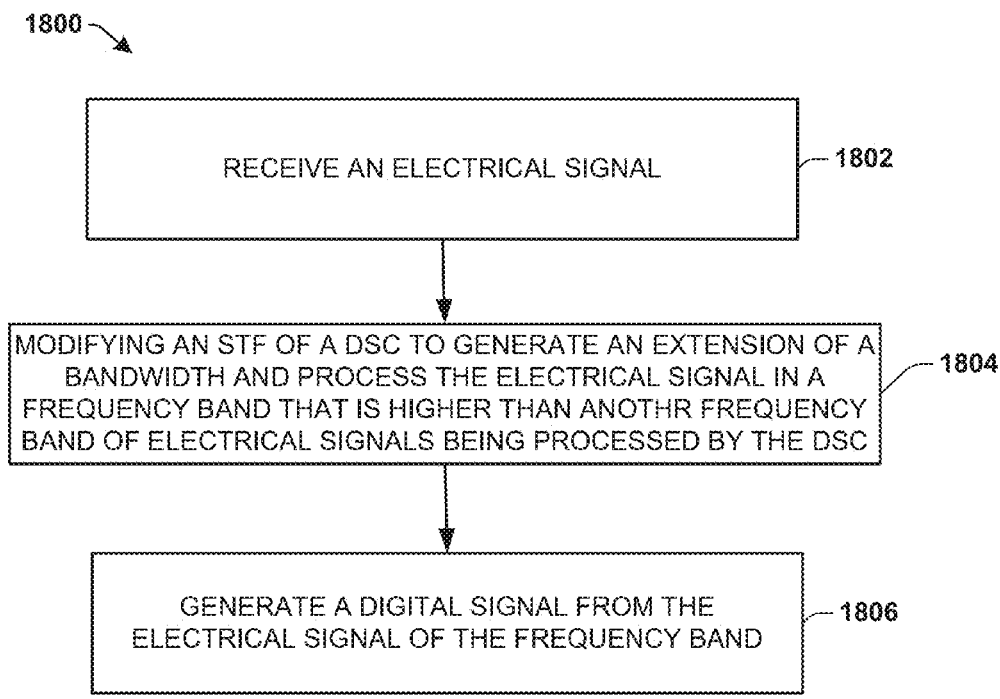
FIG. 18 is flow diagram illustrated for an example digitizing system in accordance with various aspects.

Referring to FIG. 18, illustrated is a method 1800 that enables communication with a microphone device having an audio sensor, or a digitization system having a digitization system in accordance with various aspects described herein.

At 1802, the method comprises receiving, via a delta-sigma converter 110, an electrical signal.

At 1804, the method comprises modifying, via a gain component (e.g., gain component 122), a signal transfer function of the delta-sigma converter to generate an extension of a bandwidth for processing the electrical signal in a frequency band that is higher than another frequency band of electrical signals being processed by the delta-sigma converter.

At 1806, a digital signal is generated from the electrical signal of the frequency band.

In one embodiment, the method 1800 can further comprise shaping, via a loop filter (e.g., loop filter 310), the electrical signal along a signal processing path 330 based on a feedback signal from a feedback path 316 and a plurality of coefficients b1-bi at different locations of the signal processing path 330 from a plurality of feedforward paths 301. A quantized output signal can be generated, via a quantizer 312, based on a filtered output signal from the loop filter in the extended band. In addition, a digital-to-analog converter 314 in a feedback loop 316 can convert the quantized output signal to an analog feedback signal at a location of the different locations of the signal processing path 330.

The gain component 122 can modify the signal transfer function of the delta-sigma converter 110 to generate the extension of the bandwidth by preserving a noise transfer function of the delta-sigma converter that is optimized for a lower frequency band than a higher frequency band within the extension. As such, the gain component 110 can increase a signal-to-noise ratio of the electrical signal by modifying a magnitude and phase frequency response of the signal transfer function while preserving a noise transfer function of the delta-sigma converter. A different or another electrical signal can concurrently or simultaneously be processed in a different frequency band via the delta-sigma converter 110.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize. In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A digitizing system comprising:
   a delta-sigma converter configured to receive input signals from a signal processing pathway and generate a digital output based on the input signals received from the signal processing pathway; and
   a gain component configured to modify a signal transfer function of the delta-sigma converter to generate an extension of a bandwidth of the delta-sigma converter for processing the input signals;
   wherein the gain component is further configured to amplify a signal outside of the bandwidth of the delta-sigma converter to generate the extension of the bandwidth.

2. The digitizing system of claim 1, wherein the delta-sigma converter comprises:
   a loop filter configured to shape the input signals and feedback signals to provide a filtered output signal based on a frequency band of the input signals, and a plurality of feedforward paths configured to provide coefficients only to the signal processing path;
   a quantizer configured to receive the filtered output signal and generate a quantized digital output signal based on the filtered output signal; and
   one or more feedback digital-to-analog converters configured to convert the quantized digital output signal to an analog signal as the feedback signal to the loop filter.

3. The digitizing system of claim 2, wherein the gain component comprises the plurality feedforward paths configured to feedforward a plurality of coefficients to different locations along the signal processing path of the loop filter, modify the signal transfer function of the delta-sigma converter, and generate the extension of the bandwidth by boosting an input signal gain at predetermined frequencies for processing a different frequency band.

4. The digitizing system of claim 1, wherein the gain component comprises one or more feedforward paths configured to feedforward a plurality of coefficients to modify the signal transfer function of the delta-sigma converter to generate the extension of the bandwidth by boosting a signal gain of the signal transfer function while concurrently preserving a noise transfer function.

5. The digitizing system of claim 1, further comprising a feedback signal processing path configured to provide loop filter coefficients to the signal processing path to increase a signal-to-noise ratio by modifying a noise transfer function with a high pass filter configured to minimize an in-band noise power previous to the bandwidth extension by the gain component.

6. The digitizing system of claim 1, wherein the gain component is further configured to modify the signal transfer function of the delta-sigma converter to facilitate processing of the input signals in a frequency band that is different from a previous signal of a previously processed frequency band, or another input signal being concurrently processed, by increasing a signal-to-noise ratio of the inputs signals while maintaining a noise transfer function of the delta-sigma converter.

7. The digitizing system of claim 1, wherein the gain component comprises a plurality of passive or active pathways, extending from an input node to an integrator among a plurality of integrators of the delta-sigma converter, respectively, further configured to boost a frequency band from among a plurality of frequency bands of different frequency ranges being processed while maintaining a noise level as substantially unaffected.

8. The digitizing system of claim 1, further comprising:
   a frequency booster configured to ultrasonically boost the digital outputs derived from the input signals via the delta-sigma converter to generate a multi-bit output; and
   a delta-sigma digital-to-digital converter coupled to the delta-sigma converter configured to provide a single bit output from the multi-bit output.

9. The digitizing device of claim 1, wherein the coefficient components comprise only one or more passive components that include at least one of a capacitor or a resistor.

10. The digitizing device of claim 1, wherein the different locations of the signal processing path that receive the coefficients comprise active integrators respectively coupled to one another along the signal processing path.

11. The digitizing device of claim 10, wherein the active integrators are configured to receive the coefficients by a capacitive coupling or a resistive coupling by a switched-capacitor network, and comprise an operational amplifier coupled to the switched-capacitor network.

12. The digitizing device of claim 10, wherein the active integrators are configured to receive the coefficients by a capacitive coupling or a resistive coupling, and comprise an operational amplifier and a passive network that comprises only resistors and capacitors.

13. A digitizing device comprising:
   a delta-sigma converter configured to receive one or more electrical signals and generate one or more digital outputs; and
   a gain component configured to modify a signal transfer function of the delta-sigma converter to generate an extension of a bandwidth of the delta-sigma converter for processing the one or more electrical signals in a frequency band different from the bandwidth of the delta-sigma converter, wherein the gain component comprises a plurality of feedforward paths comprising coefficient components configured to provide different coefficients along different locations of a signal processing path of a loop filter, wherein a number of the plurality of feedforward paths correspond to a polynomial order of the loop filter.

14. The digitizing device of claim 13, further comprising:
a loop filter configured to filter the one or more electrical signals received at an input and feedback signal along a signal and noise processing path via a plurality of filter components;
a quantizer configured to generate quantized digital output signals of the bandwidth of the delta-sigma converter and a different frequency band; and
one or more feedback digital-to-analog converters configured to convert the quantized digital output signals to analog signals to the loop filter.

15. The digitizing device of claim 13, wherein the gain component is further configured to modify the signal transfer function of the delta-sigma converter to generate the extension of the bandwidth for processing the one or more electrical signals in a higher frequency band than a frequency band of the delta-sigma converter.

16. The digitizing device of claim 13, wherein the gain component is further configured to increase a signal-to-noise ratio of the one or more electrical signals by modifying a magnitude and phase frequency response of the signal transfer function while preserving a noise transfer function of the delta-sigma converter.

17. The digitizing device of claim 13, wherein the gain component is further configured to increase a signal gain of the signal transfer function of the delta-sigma converter to increase the bandwidth for processing the one or more electrical signals in a higher frequency band than another frequency band of other electrical signals processed via the delta-sigma converter.

18. A method for a digitizing system comprising:
receiving, via a delta-sigma converter, an electrical signal;
modifying, via a gain component, a signal transfer function of the delta-sigma converter to generate an extension of a bandwidth for processing the electrical signal in a frequency band that is higher than another frequency band of electrical signals being processed by the delta-sigma converter;
generating a digital signal from the electrical signal of the frequency band;
increasing a signal-to-noise ratio of the electrical signal by modifying a magnitude and phase frequency response of the signal transfer function while preserving a noise transfer function of the delta-sigma converter; and
processing another electrical signal in a different frequency band via the delta-sigma converter.

19. The method of claim 18, further comprising:
shaping, via a loop filter, the electrical signal along a signal processing path based on a feedback signal from a feedback path and a plurality of coefficients at different locations of the signal processing path from a plurality of feedforward paths.

20. The method of claim 19, further comprising:
generating a quantized output signal, via a quantizer, based on a filtered output signal from the loop filter in the extended band; and
converting, via a digital-to-analog converter in a feedback loop, the quantized output signal to an analog feedback signal at a location of the different locations of the signal processing path.

21. The method of claim 18, wherein the modifying, via the gain component, the signal transfer function of the delta-sigma converter to generate the extension of the bandwidth comprises preserving the noise transfer function of the delta-sigma converter that is optimized for a lower frequency band than a higher frequency band within the extension.

22. The method of claim 18, further comprising:
feedforwarding, via the gain component, a plurality of coefficients from an input of the delta-sigma converter to different active integrators along a signal processing path of a loop filter to increase the bandwidth into a higher frequency band.

* * * * *